US 12,284,833 B2

(12) United States Patent
Okubo

(10) Patent No.: US 12,284,833 B2
(45) Date of Patent: *Apr. 22, 2025

(54) SEMICONDUCTOR DEVICE AND PROTECTION CIRCUIT INCLUDING DIODE AND BURIED WIRING

(71) Applicant: SOCIONEXT INC., Kanagawa (JP)

(72) Inventor: Kazuya Okubo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 440 days.

This patent is subject to a terminal disclaimer.

(21) Appl. No.: 17/529,746

(22) Filed: Nov. 18, 2021

(65) Prior Publication Data

US 2022/0077138 A1    Mar. 10, 2022

Related U.S. Application Data

(63) Continuation of application No. PCT/JP2019/020476, filed on May 23, 2019.

(51) Int. Cl.
*H10D 89/60* (2025.01)
*H10D 84/00* (2025.01)

(52) U.S. Cl.
CPC .......... *H10D 89/611* (2025.01); *H10D 89/921* (2025.01); *H10D 84/00* (2025.01); *H10D 89/811* (2025.01)

(58) Field of Classification Search
CPC ............. H01L 27/0255; H01L 27/0292; H01L 21/823431; H01L 21/823821;

(Continued)

(56) References Cited

U.S. PATENT DOCUMENTS 9,224,725 B2    12/2015  Usami
9,570,395 B1     2/2017  Sengupta et al.
(Continued)

FOREIGN PATENT DOCUMENTS

CN    109219874 A    1/2019
JP    2001-284537 A   10/2001
(Continued)

OTHER PUBLICATIONS

International Search Report issued in International Application No. PCT/JP2019/020476 dated Jul. 16, 2019; with English translation.

(Continued)

*Primary Examiner* — Ratisha Mehta
*Assistant Examiner* — Brad A Knudson
(74) *Attorney, Agent, or Firm* — Rimon P.C.

(57) ABSTRACT

A semiconductor device includes a first wiring; a first circuit region provided with a first power supply wiring and a first ground wiring; a second circuit region provided with a second power supply wiring and a second ground wiring; and a bidirectional diode connected between the first and second ground wirings, and provided with first and second diodes. The first diode includes a first impurity region of a first conductive type, connected to the second ground wiring, and a second impurity region of a second conductive type, connected to the first ground wiring. The second diode includes a third impurity region of the second conductive type connected to the second ground wiring, and a fourth impurity region of the first conductive type connected to the first ground wiring. Any of the first to fourth impurity regions, or any combination of the impurity regions is connected to the first wiring.

25 Claims, 26 Drawing Sheets

(58) Field of Classification Search
CPC ..... H01L 21/845; H01L 21/822; H01L 23/60; H01L 23/535; H01L 23/5286; H01L 27/04; H01L 23/485; H01L 21/76895; H10D 89/611; H10D 89/921; H10D 84/00; H10D 89/811; H10D 84/038
See application file for complete search history.

(56) References Cited

U.S. PATENT DOCUMENTS

| | | |
|---|---|---|
| 2001/0035555 A1 | 11/2001 | Nonaka |
| 2003/0174452 A1* | 9/2003 | Chen .................. H01L 27/0255 361/56 |
| 2004/0088669 A1* | 5/2004 | Loh ........................ G06F 30/39 257/773 |
| 2008/0253045 A1* | 10/2008 | Sato ................... H01L 27/0251 361/56 |
| 2012/0033335 A1 | 2/2012 | Wang et al. |
| 2014/0252476 A1* | 9/2014 | Chang ............... H01L 29/66795 438/157 |
| 2015/0187753 A1* | 7/2015 | Campi, Jr. .......... H01L 27/0255 257/357 |
| 2016/0020203 A1* | 1/2016 | Zhang ................ H01L 27/0255 257/355 |
| 2016/0372453 A1 | 12/2016 | Suzuki |
| 2017/0294448 A1 | 10/2017 | Debacker et al. |
| 2018/0145030 A1* | 5/2018 | Beyne ............... H01L 21/76251 |
| 2018/0190670 A1 | 7/2018 | Ryckaert et al. |
| 2018/0294267 A1* | 10/2018 | Licausi ............... H01L 27/0924 |
| 2018/0337231 A1 | 11/2018 | Tanaka |
| 2018/0374791 A1 | 12/2018 | Smith et al. |
| 2019/0080969 A1 | 3/2019 | Tsao |
| 2019/0081032 A1 | 3/2019 | Okubo |

FOREIGN PATENT DOCUMENTS

| | | |
|---|---|---|
| JP | 2001-298157 A | 10/2001 |
| JP | 2008-263076 A | 10/2008 |
| JP | 2009-021622 A | 1/2009 |
| JP | 2009-146977 A | 7/2009 |
| JP | 2012-049444 A | 3/2012 |
| JP | 2015-103605 A | 6/2015 |
| JP | 2015-179740 A | 10/2015 |
| JP | 2016-178197 A | 10/2016 |
| JP | 2017-011069 A | 1/2017 |
| WO | 2017/212644 A1 | 12/2017 |

OTHER PUBLICATIONS

Written Opinion of the International Searching Authority of International Application No. PCT/JP2019/020476 dated Jul. 16, 2019; with English translation of the relevant part.
Chinese Office Action dated Jun. 17, 2024 issued in the corresponding Chinese Patent Application No. 201980096522.7, with English translation.
International Search Report issued in corresponding International Application No. PCT/JP2019/020469, dated Jul. 16, 2019 with English translation.
Written Opinion of the International Searching Authority issued in corresponding International Application No. PCT/JP2019/020469, dated Jul. 16, 2019 with English translation of the relevant parts.
Chinese Office Action dated Feb. 3, 2024 issued in the corresponding Chinese Patent Application No. 201980096522.7 with English machine translation.
Notice of Allowance dated Jan. 25, 2024 issued in the corresponding U.S. Appl. No. 17/529,252.
Chinese Office Action dated Aug. 20, 2024 issued in the corresponding Chinese Patent Application No. 201980096512.3, with English machine translation.

* cited by examiner

US 12,284,833 B2

SEMICONDUCTOR DEVICE AND PROTECTION CIRCUIT INCLUDING DIODE AND BURIED WIRING

CROSS-REFERENCE TO RELATED APPLICATION

The present application is a continuation application of International Application No. PCT/JP2019/020476, filed May 23, 2019. The contents of this application are incorporated herein by reference in their entirety.

BACKGROUND OF THE INVENTION

1. Field of the Invention

The present disclosure relates to semiconductor devices.

2. Description of the Related Art

Semiconductor devices may include domains for analog circuits and domains for logic circuits. In this case, a bidirectional diode may be provided between a power source wiring of VSS of the domain for analog circuit and a power source wiring of VSS of the domain for logic circuit.

The power supply wirings are mainly provided above substrates. Recently, semiconductor devices in which power supply wirings are buried in the substrates have been proposed. The power supply wiring having such a structure is sometimes referred to as a BPR (Buried Power Rail). (See, for example, U.S. Patent Application Publication No. 2016/0372453, U.S. Patent Application Publication No. 2012/0033335, U.S. Pat. No. 9,224,725, U.S. Patent Application Publication No. 2018/0374791, U.S. Patent Application Publication No. 2018/0190670, U.S. Patent Application Publication No. 2018/0294267, U.S. Patent Application Publication No. 2017/0294448, and U.S. Pat. No. 9,570,395.

SUMMARY OF INVENTION

Problem to be Solved by the Invention

Configurations of semiconductor devices including the bidirectional diodes using buried wirings such as BPR have not been specifically studied in detail yet.

It is an object of the present invention to provide a semiconductor device capable of implementing a bidirectional diode including a buried wiring.

Means for Solving Problems

According to an aspect of the present disclosure, a semiconductor device includes a substrate; a first wiring formed in the substrate; a first circuit region provided with a first power supply wiring and a first ground wiring; a second circuit region provided with a second power supply wiring and a second ground wiring; and a bidirectional diode connected between the first ground wiring and the second ground wiring, and provided with a first diode and a second diode. The first diode includes a first impurity region of a first conductive type, electrically connected to the second ground wiring, and a second impurity region of a second conductive type, different from the first conductive type, electrically connected to the first ground wiring. The second diode includes a third impurity region of the second conductive type electrically connected to the second ground wiring, and a fourth impurity region of the first conductive type electrically connected to the first ground wiring. The first impurity region, the second impurity region, the third impurity region, or the fourth impurity region, or any combination of the impurity regions is connected to the first wiring.

Effects of the Invention

According to the disclosure of the present application, a bidirectional diode including a buried wiring can be implemented.

BRIEF DESCRIPTION OF DRAWINGS

Other objects and further features of the present disclosure will be apparent from the following detailed description when read in conjunction with the accompanying drawings, in which.

MODE FOR CARRYING OUT THE INVENTION

Figure 1:
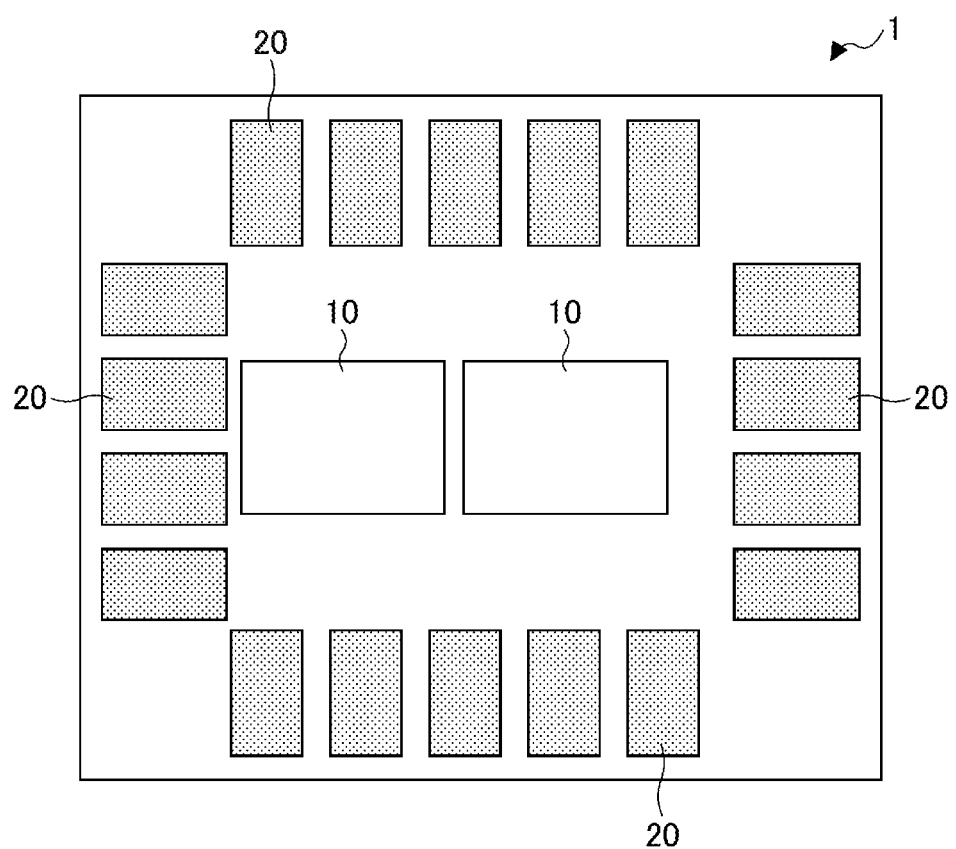
FIG. 1 is a diagram depicting an example of a layout of a semiconductor device according to a first embodiment.

In the following, embodiments will be described in detail with reference to the accompanying drawings. In the present specification and the drawings, components having substantially the same functional structure are assigned the same reference numeral, and overlapping descriptions may be omitted. In the following description, two directions parallel to a surface of the substrate and orthogonal to each other are defined to be an X-direction and a Y-direction, and a direction orthogonal to the surface of the substrate is defined to be a Z-direction. Moreover, alignment of arrangement in the present disclosure does not strictly mean that any inconsistency due to manufacturing variation is excluded, and even if the arrangement is misaligned due to the manufacturing variation, the arrangement can be regarded as aligned.

First Embodiment

Figure 2:
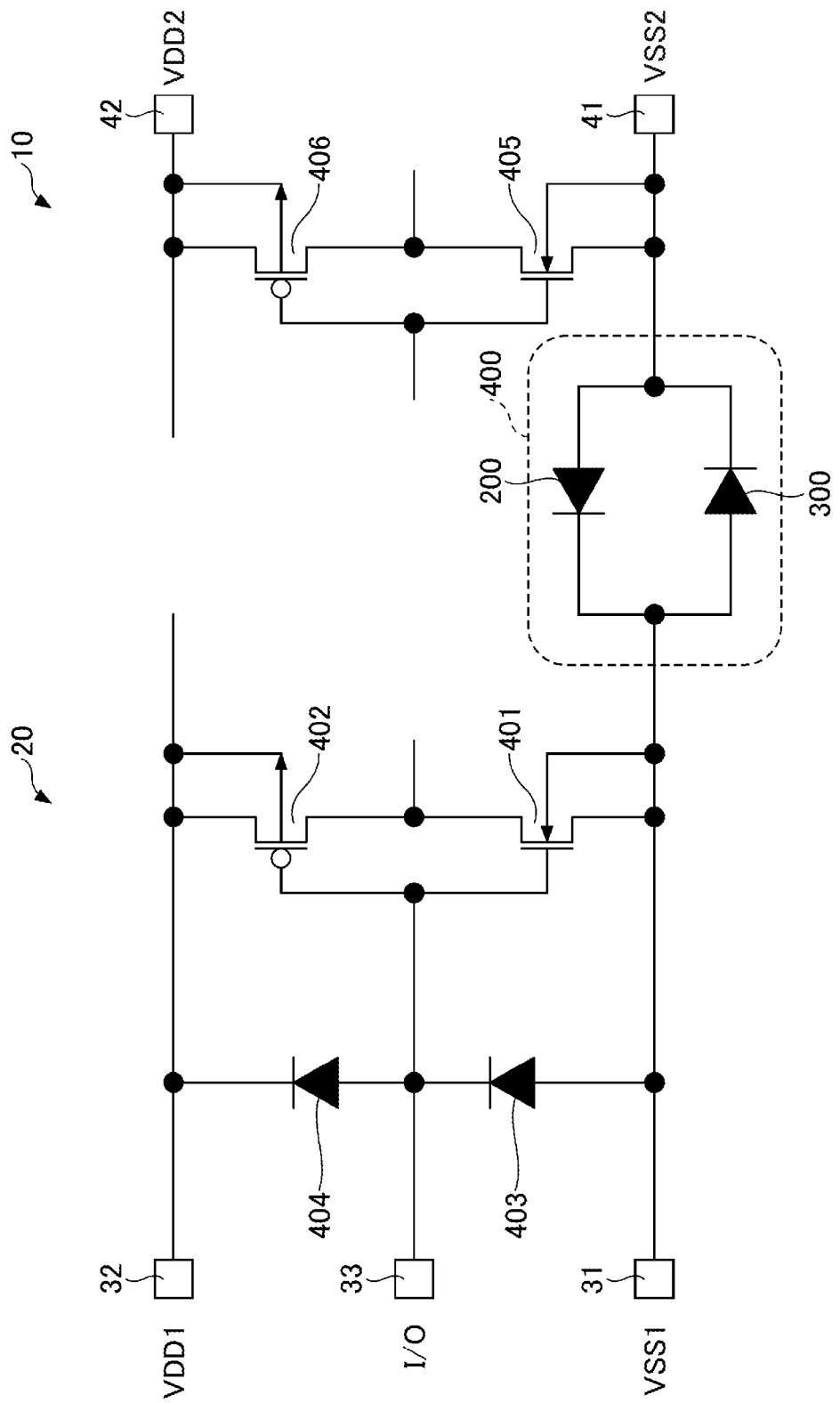
FIG. 2 is a circuit diagram depicting an example of a configuration of an analog circuit region included in the semiconductor device according to the first embodiment.

A first embodiment will be described. FIG. 1 is a diagram illustrating a layout of a semiconductor device according to the first embodiment. FIG. 2 is a circuit diagram illustrating a configuration of an analog circuit region 20 included in the semiconductor device according to the first embodiment.

As shown in FIG. 1, the semiconductor device 1 according to the first embodiment includes a plurality of logic circuit regions 10 and an analog circuit region 20 arranged around the internal circuit regions 10. It should be noted that the number of the logic circuit regions 10 arranged on the semiconductor device 1 may be 1, or may be 3 or more.

As shown in FIG. 2, the analog circuit region 20 includes a first VSS pad 31, a first VDD pad 32, and an I/O pad 33. To the first VSS pad 31, a VSS1 wiring that supplies a VSS1 power supply potential to a circuit in the analog circuit region 20 is connected. The VSS1 power supply potential is, for example, a ground potential. To the first VDD pad 32, a VDD1 wiring that supplies a VDD1 power supply potential to a circuit in the analog circuit region 20 is connected. The analog circuit region 20 has an inverter that includes, for example, an N-channel MOS transistor 401 and a P-channel MOS transistor 402. For example, a gate of the N-channel MOS transistor 401 and a gate of the P-channel MOS transistor 402 are connected to the I/O pad 33. For example, a source of the N-channel MOS transistor 401 is connected to the first VSS pad 31, and a source of the P-channel MOS transistor 402 is connected to the first VDD pad 32. The VSS1 wiring is sometimes referred to as a ground wiring, and the VDD1 wiring is sometimes referred to as a power supply wiring.

As shown in FIG. 2, the analog circuit region 20 includes an ESD protection circuit that includes a diode 403 and a diode 404. An anode of the diode 403 is connected to the first VSS pad 31 and a cathode of the diode 403 is connected to the I/O pad 33. An anode of the diode 404 is connected to the I/O pad 33 and a cathode of the diode 404 is connected to the first VDD pad 32.

As shown in FIG. 2, the logic circuit region 10 includes a second VSS pad 41 and a second VDD pad 42. To the second VSS pad 41, a VSS2 wiring that supplies a VSS2 power supply potential to a circuit in the logic circuit region 10 is connected. The VSS2 power supply potential is, for example, a ground potential. To the second VDD pad 42, a VDD2 wiring that supplies a VDD2 power supply potential to a circuit in the logic circuit region 10 is connected. The logic circuit region 10 has an inverter that includes, for example, an N-channel MOS transistor 405 and a P-channel MOS transistor 406. For example, a gate of the N-channel MOS transistor 405 and a gate of the P-channel MOS transistor 406 are connected to a common signal line. For example, a source of the N-channel MOS transistor 405 is connected to the second VSS pad 41 and a source of the P-channel MOS transistor 406 is connected to the second VDD pad 42. The VSS2 wiring is sometimes referred to as a ground wiring, and the VDD2 wiring is sometimes referred to as a power supply wiring.

As shown in FIG. 2, the bidirectional diode 400 is connected between the VSS2 wiring of the logic circuit region 10 and the VSS1 wiring of the analog circuit region 20. The bidirectional diode 400 includes the diode 200 and the diode 300. An anode of the diode 200 is connected to the first VSS pad 31 via the VSS1 wiring and a cathode of the diode 200 is connected to the second VSS pad 41 via the VSS2 wiring. An anode of the diode 300 is connected to the second VSS pad 41 via the VSS2 wiring and a cathode of the diode 300 is connected to the first VSS pad 31 via the VSS1 wiring.

Figure 3:
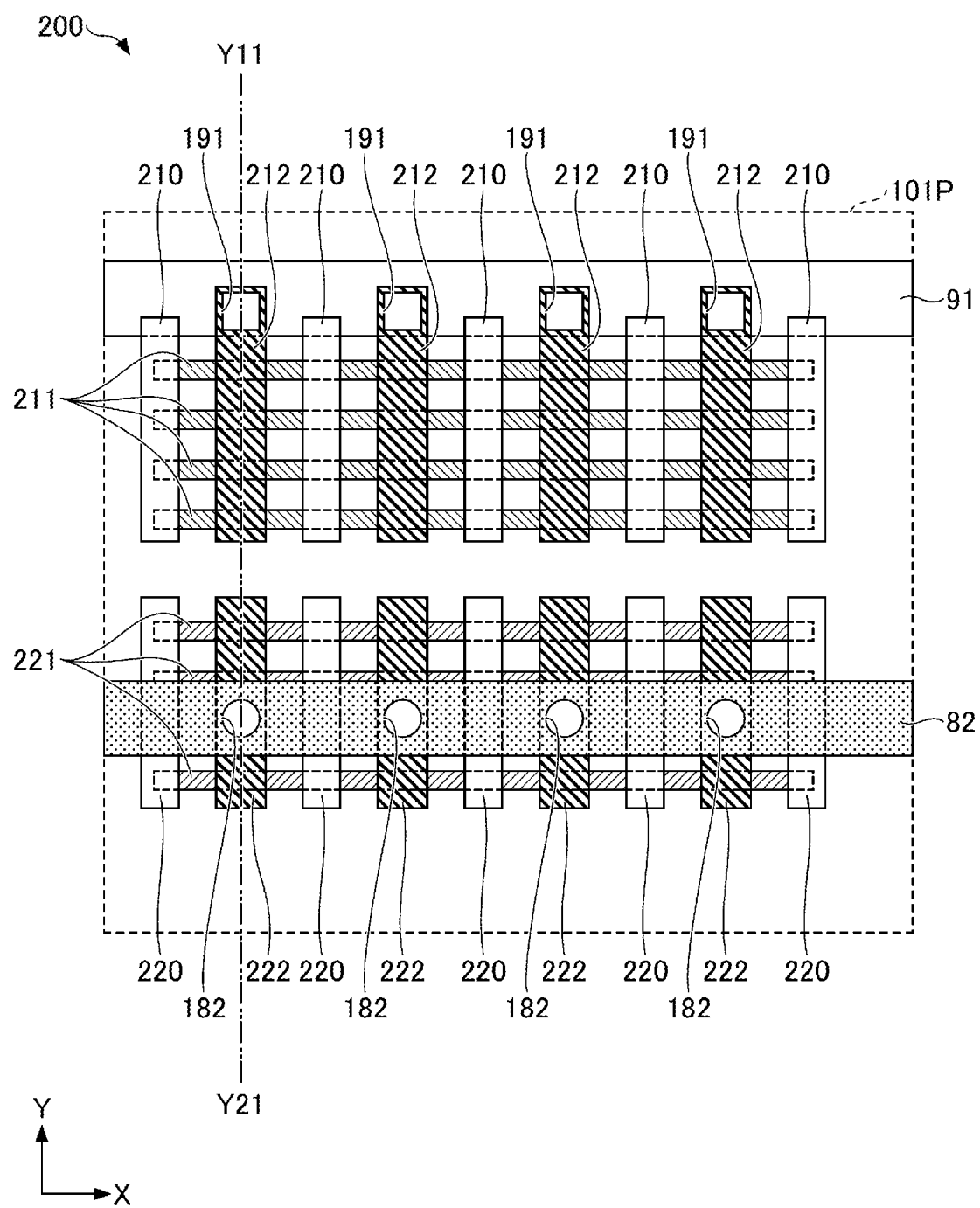
FIG. 3 is a diagram schematically depicting a planar configuration of one diode according to the first embodiment.
Figure 4:
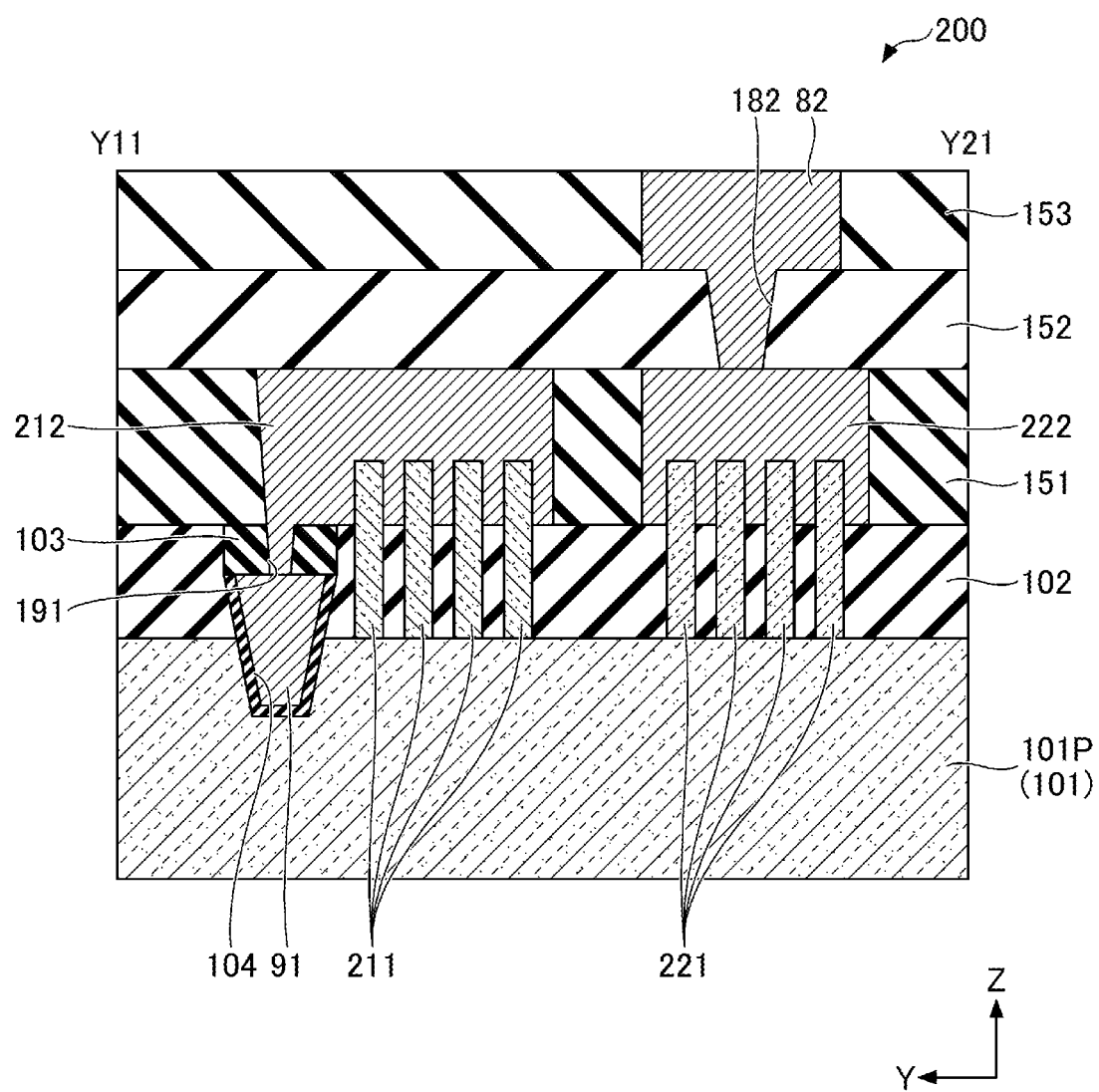
FIG. 4 is a cross-sectional view illustrating the one diode according to the first embodiment.

Next, the configuration of the diode 200 will be described. FIG. 3 is a schematic diagram illustrating a planar configuration of the diode 200 according to the first embodiment. FIG. 4 is a cross-sectional view illustrating the diode 200 according to the first embodiment. FIG. 4 is a diagram depicting a cross section cut along a line Y11-Y21 in FIG. 3.

As shown in FIGS. 3 and 4, a P-well 101P is formed in the surface of the substrate 101, and an element separation film 102 is formed on the surface of the P-well 101P. The element separation film 102 is formed, for example, by using a Shallow Trench Isolation (STI) method. In the P-well 101P and the element separation film 102, a groove extending in the X-direction is formed, and in the groove a power source wiring 91 is formed via an insulation film 104. For example, the surface of the power source wiring 91 is covered by the insulation film 103. For example, the surface of the element separation film 102 and the surface of the insulation film 103 may be flush with or may not be flush with the surface of the P-well 101P. For example, the power source wiring 91 is connected to the first VSS pad 31. The conductive type of the substrate 101 may be a P-type. In this case, the P-well 101P can be read as a P-type substrate 101P. The same applies to other embodiments and variations.

A plurality of N-type fins 211 and a plurality of P-type fins 221 extending in the X-direction and standing in the Z-direction are formed on the P-well 101P exposed from the element separation film 102. In the embodiment, four N-type fins 211 and four P-type fins 221 are formed. For example, in the Y-direction, the N-type fin 211 is located between the power source wiring 91 and the P-type fin 221. The P-type fin 221 serves as an anode of the diode 200 and the N-type fin 211 serves as a cathode of the diode 200.

A plurality of local wirings 212 extending in the Y-direction and connected to the N-type fins 211 are formed on the element separation film 102. In the embodiment, four local wirings 212 are formed. A plurality of dummy-gate electrodes 210, such as gate electrodes of so-called fin transistors, are formed in the X-direction so as to arrange the local wiring 212 between an adjacent pair of the dummy-gate electrodes 210. The dummy-gate electrode 210 extends in the Y-direction. A dummy-gate insulation film (not shown) is formed between the dummy-gate electrode 210 and the N-type fin 211.

A plurality of local wirings 222 extending in the Y-direction and connected to the P-type fins 221 are formed on the element separation film 102. In the embodiment, four local wirings 222 are formed. A plurality of dummy-gate electrodes 220, such as gate electrodes of so-called fin transistors, are formed in the X-direction so as to arrange the local wiring 222 between the adjacent pair of the dummy-gate electrodes 220. The dummy-gate electrode 220 extends in the Y-direction. A dummy-gate insulation film (not shown) is formed between the dummy-gate electrode 220 and the P-type fin 221.

As shown in FIG. 4, an insulation film 151 is formed above the P-well 101P and the element separation film 102. The local wirings 212 and 222 and the dummy-gate electrodes 210 and 220 are buried in the insulation film 151. An insulation film 152 is formed over the insulation film 151, and the local wirings 212 and 222, and above the dummy-gate electrodes 210 and 220, and an insulation film 153 is formed over the insulation film 152.

A contact hole 191 is formed in the insulation film 103 between the local wiring 212 and the power source wiring 91, and the local wiring 212 is connected to the power source wiring 91 via a conductor in the contact hole 191.

In the insulation film 152, a contact hole 182 reaching the local wiring 222 is formed. In the insulation film 153, a power supply wiring 82 is formed which extends in the X-direction and is connected to the local wiring 222 through a conductor in the contact hole 182. For example, the power supply wiring 82 is connected to the second VSS pad 41.

Figure 5:
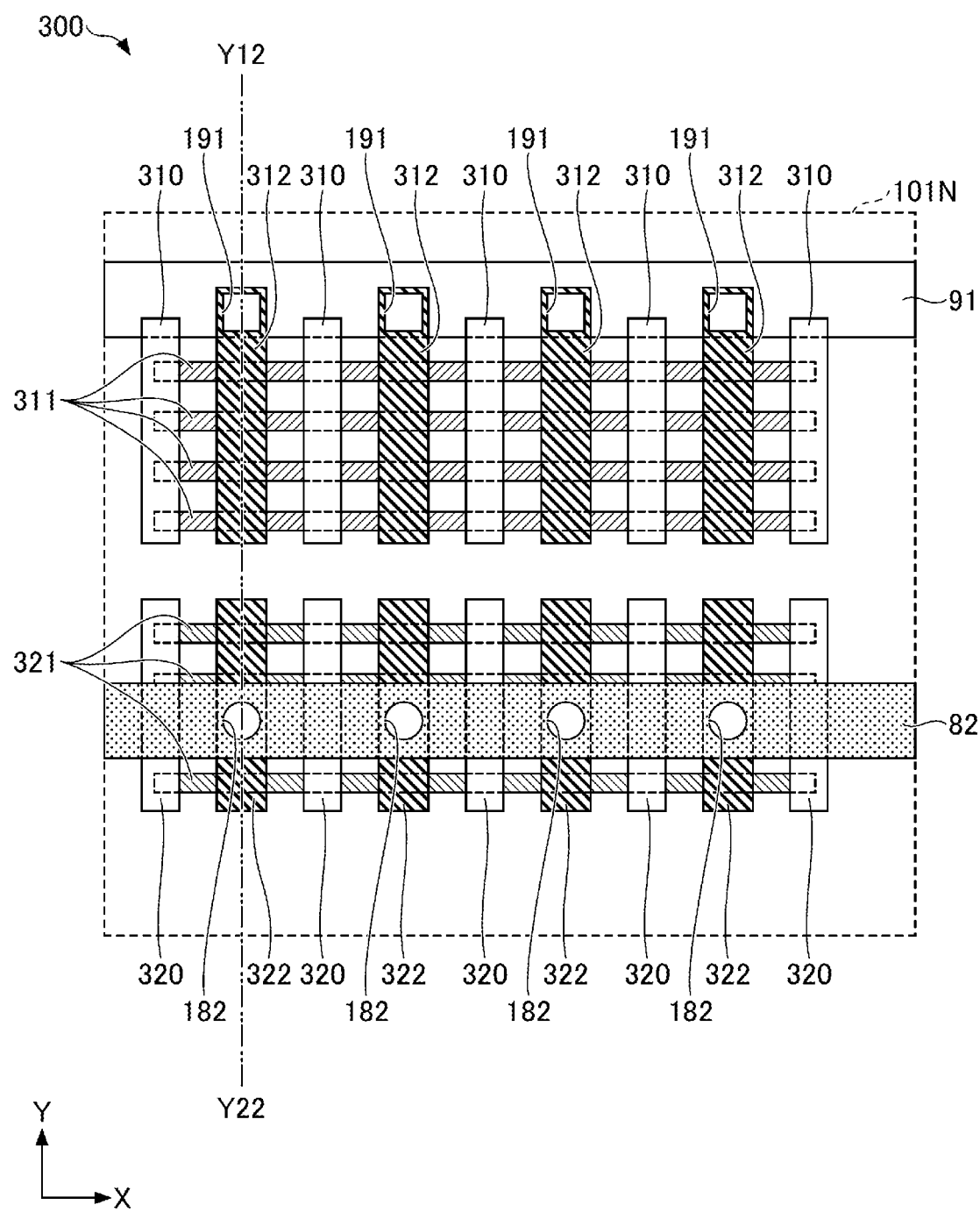
FIG. 5 is a diagram schematically depicting a planar configuration of another diode according to the first embodiment.
Figure 6:
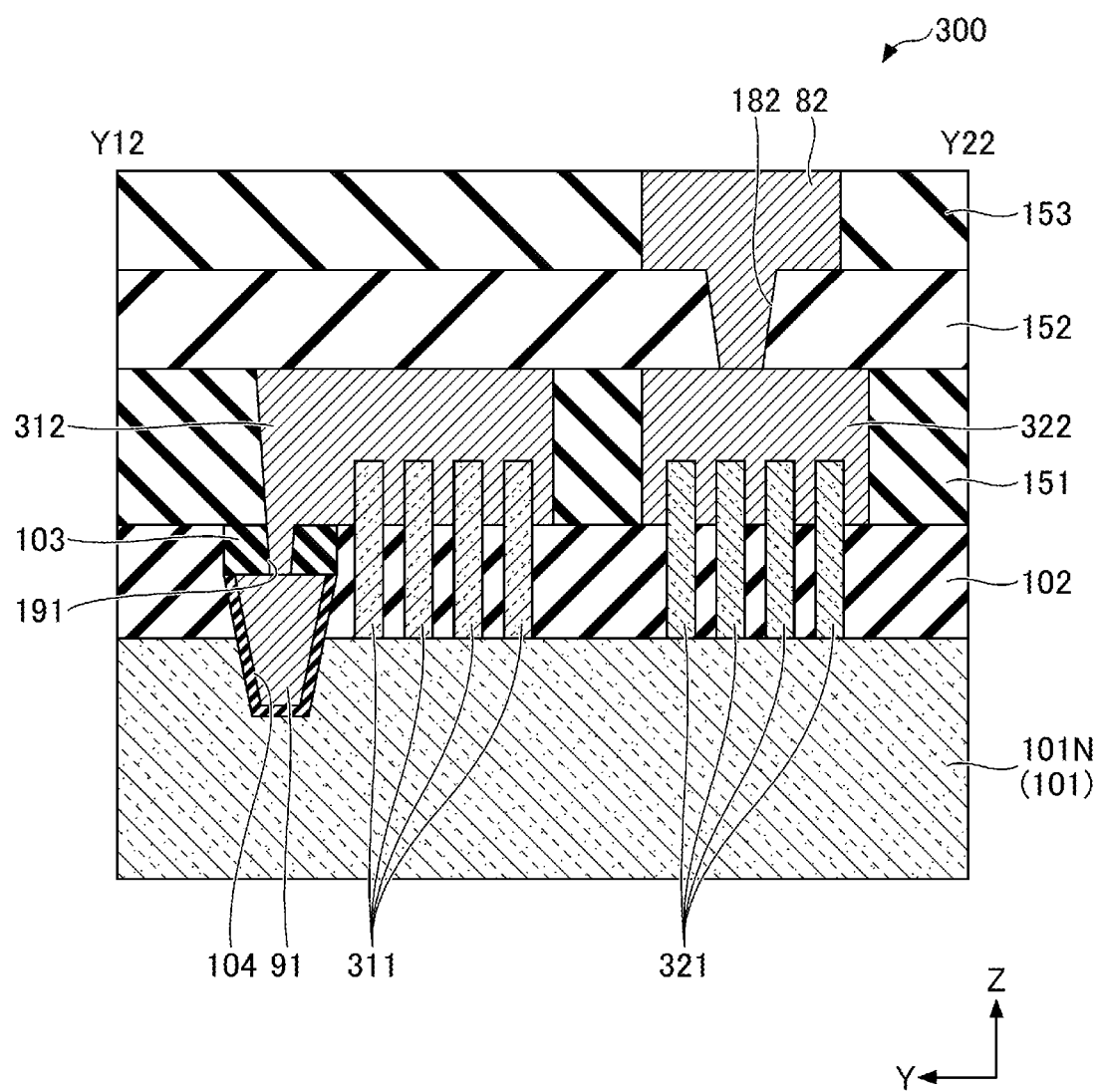
FIG. 6 is a cross-sectional view illustrating the other diode according to the first embodiment.

Next, the configuration of the diode 300 will be described. FIG. 5 is a schematic diagram showing a planar configuration of the diode 300 according to the first embodiment. FIG. 6 is a cross-sectional view illustrating the diode 300 according to the first embodiment. FIG. 6 is a diagram depicting a cross section cut along a line Y12-Y22 in FIG. 5.

As shown in FIGS. 5 and 6, an N-well 101N is formed in the surface of the substrate 101, and an element separation film 102 is formed on the surface of the N-well 101N. In the N-well 101N and the element separation film 102, a groove extending in the X-direction is formed, and in the groove a power source wiring 91 is formed via an insulation film 104. For example, the surface of the power source wiring 91 is covered by the insulation film 103. For example, the surface of the element separation film 102 and the surface of the insulation film 103 may be flush with or may not be flush with the surface of the N-well 101N.

A plurality of P-type fins 311 and a plurality of N-type fins 321 extending in the X-direction and standing in the Z-direction are formed on the N-well 101N exposed from the element separation film 102. In the embodiment, four P-type fins 311 and four N-type fins 321 are formed. For example, in the Y-direction, the P-type fin 311 is located between the power source wiring 91 and the N-type fin 321. The P-type fin 311 serves as an anode of diode 300 and the N-type fin 321 serves as a cathode of the diode 300.

A plurality of local wirings 312 extending in the Y-direction and connected to the P-type fins 311 are formed on the element separation film 102. In the embodiment, four local wirings 312 are formed. A plurality of dummy-gate electrodes 310, such as gate electrodes of so-called fin-transistors, are formed in the X-direction so as to arrange the local wiring 312 between the adjacent pair of the dummy-gate electrodes 310. The dummy-gate electrode 310 extends in the Y-direction. A dummy-gate insulation film (not shown) is formed between the dummy-gate electrode 310 and the P-type fin 311.

A plurality of local wirings 322 extending in the Y-direction and connected to the N-type fins 321 are formed on the element separation film 102. In the embodiment, four local wirings 322 are formed. A plurality of dummy-gate electrodes 320, such as gate electrodes of so-called fin transistors, are formed in the X-direction so as to arrange the local wiring 322 between the adjacent pair of the dummy-gate electrodes 320. The dummy-gate electrode 320 extends in the Y-direction. A dummy-gate insulation film (not shown) is formed between the dummy-gate electrode 320 and the N-type fin 321.

As shown in FIG. 6, an insulation film 151 is formed above the N-well 101N and the element separation film 102. The local wiring 312 and 322 and the dummy-gate electrodes 310 and 320 are buried in the insulation film 151. The insulation film 152 is formed over the insulation film 151, and the local wirings 312 and 322, and above the dummy-gate electrodes 310 and 320, and the insulation film 153 is formed over the insulation film 152.

The contact hole 191 is formed in the insulation film 103 between the local wiring 312 and the power supply wiring 91, and the local wiring 312 is connected to the power source wiring 91 through a conductor in the contact hole 191.

In the insulation film 152, a contact hole 182 reaching the local wiring 322 is formed. In the insulation film 153, a power supply wiring 82 is formed which extends in the X-direction and is connected to the local wiring 322 through a conductor in the contact hole 182. For example, the power supply wiring 82 is connected to the second VSS pad 41.

In the first embodiment, the diode 200 includes the power source wiring 91 as a buried wiring, and the diode 300 includes the power source wiring 91 as a buried wiring. Thus, according to the first embodiment, a bidirectional diode including buried wirings can be implemented. Therefore, the configuration of the wirings according to the first embodiment is suitable for miniaturization of semiconductor devices.

In addition, in the diode 200, instead of the power supply wiring 82, a power supply wiring connected to the local wiring 222 may be formed in the P-well 101P as the buried wiring. Similarly, in the diode 300, instead of the power supply wiring 82, a power supply wiring connected to the local wiring 322 may be formed in the N-well 101N as the buried wiring. In addition, in the diodes 200 and 300, instead of the power source wiring 91, a power source wiring connected to the local wiring 212 and a power source wiring connected to the local wiring 312 may be formed in the insulation film 153, respectively. Furthermore, the number of the fins, the dummy-gate electrodes, and the local wirings in the diodes 200 and 300 may be changed accordingly.

First Variation of the First Embodiment

Figure 7:
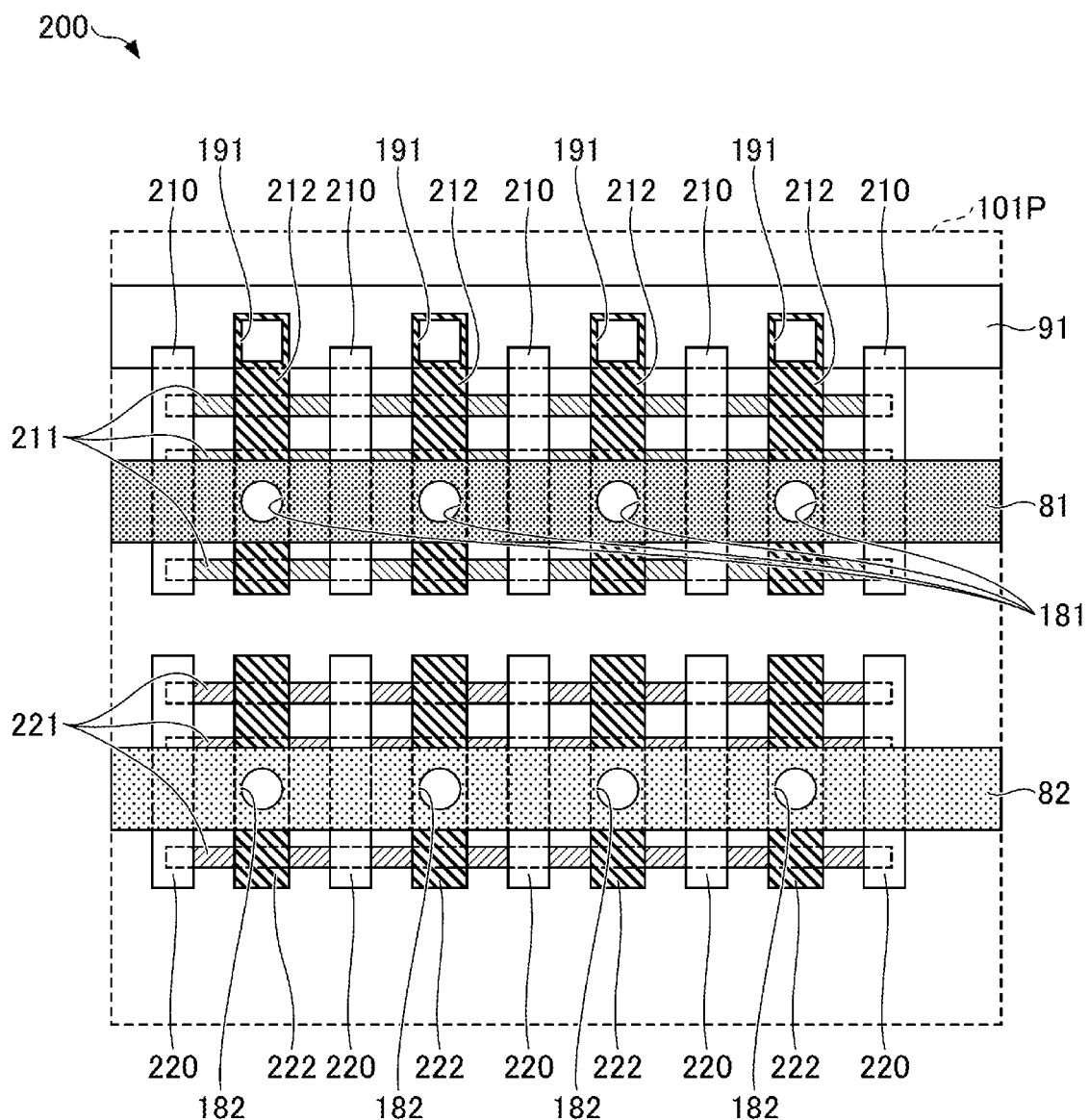
FIG. 7 is a diagram schematically depicting a planar configuration of one diode according to a first variation of the first embodiment.
Figure 8:
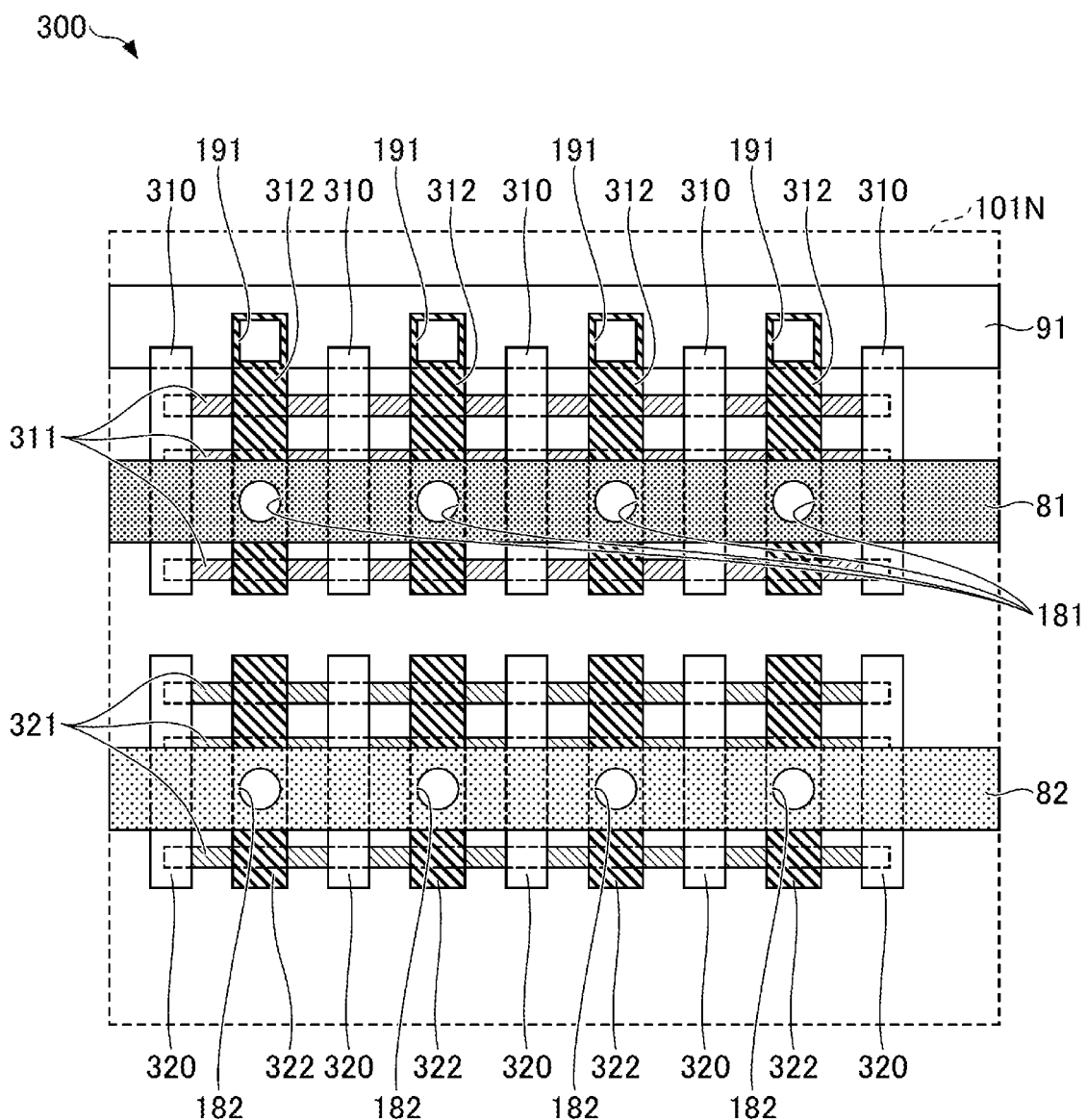
FIG. 8 is a diagram schematically depicting a planar configuration of another diode according to the first variation of the first embodiment.

Next, a first variation of the first embodiment will be described. The first variation differs from the first embodiment mainly in that a power source wiring 81 is provided in parallel with the power source wiring 91. FIG. 7 is a schematic diagram showing a planar configuration of the diode 200 according to the first variation of the first embodiment. FIG. 8 is a schematic diagram showing a planar configuration of the diode 300 according to the first variation of the first embodiment.

As shown in FIG. 7, in the first variation of the first embodiment, in the insulation film 152 (see FIG. 4) in the diode 200, a contact hole 181 reaching the local wiring 212 is formed. The power source wiring 81 that extends in the X-direction and is connected to the local wiring 212 through a conductor in the contact hole 181 is formed in the insulation film 153.

As shown in FIG. 8, in the first variation of the first embodiment, in the insulation film 152 (see FIG. 4) in the diode 300, a contact hole 181 reaching the local wiring 312 is formed. The power supply wiring 81 that extends in the X-direction and is connected to the local wiring 312 through a conductor in the contact hole 181 is formed in the insulation film 153.

Other configurations of the semiconductor device according to the first variation of the first embodiment are the same as those of the first embodiment.

According to the first variation of the first embodiment, the same effect as the first embodiment can be obtained. Additionally, in the first variation, the diode 200 is provided with the power supply wiring 81 connected to the local wiring 212 to which the power supply wiring 91 is connected, and the diode 300 is provided with the power supply wiring 81 connected to the local wiring 312 to which the power supply wiring 91 is connected. Thus, it is possible to reduce the electric resistance of the wiring connected to the first VSS pad 31.

In addition, the power supply wiring 81 in the diode 200 and the power supply wiring 81 in the diode 300 may be connected to each other above the substrate 101.

If a part of the power supply wiring connected to the second VSS pad 41 is buried, a power supply wiring connected to a local wiring to which the buried wiring is connected may be provided above the substrate 101 to reduce the electric resistance.

Second Embodiment

Figure 9:
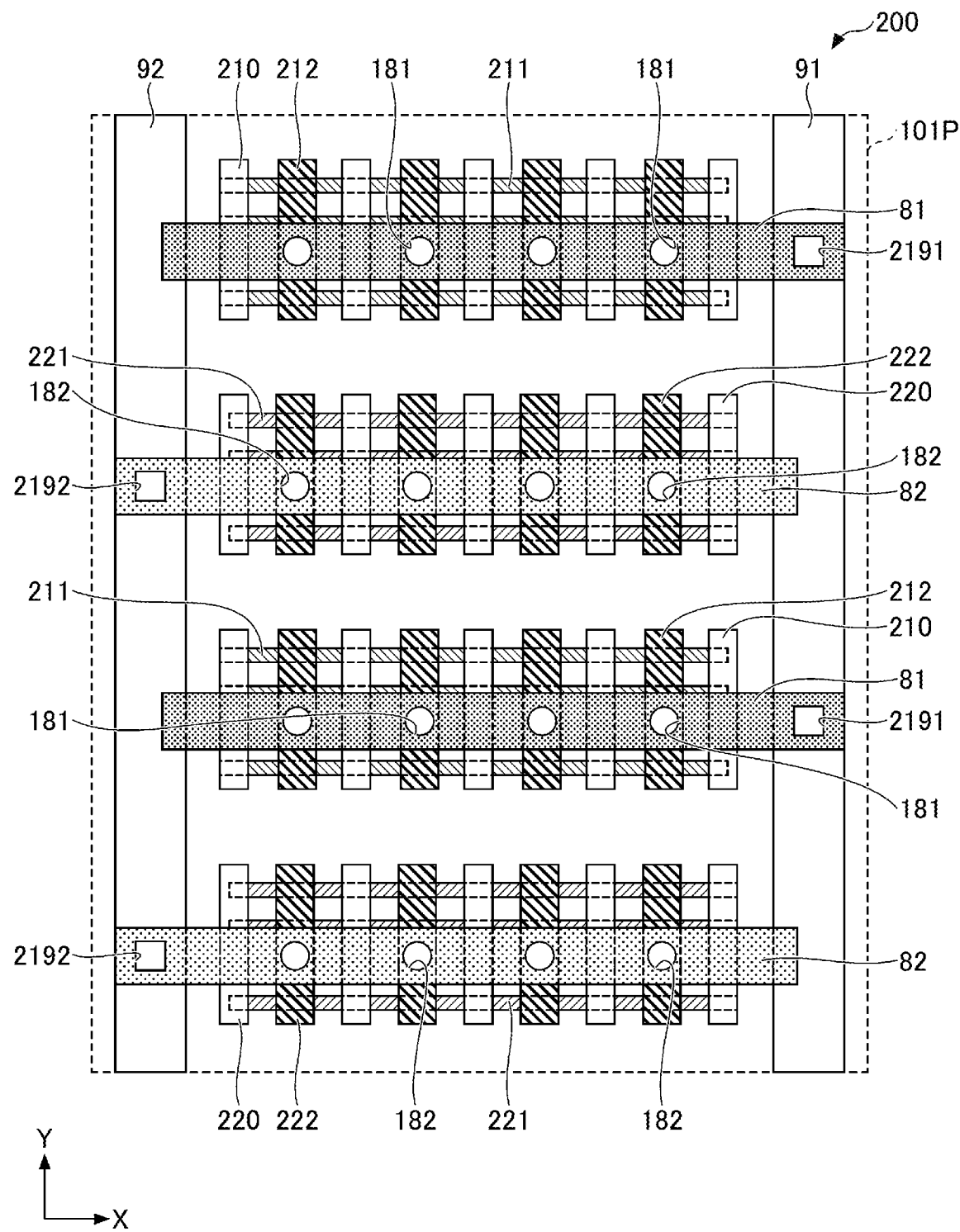
FIG. 9 is a diagram schematically depicting a planar configuration of one diode according to a second embodiment.
Figure 10:
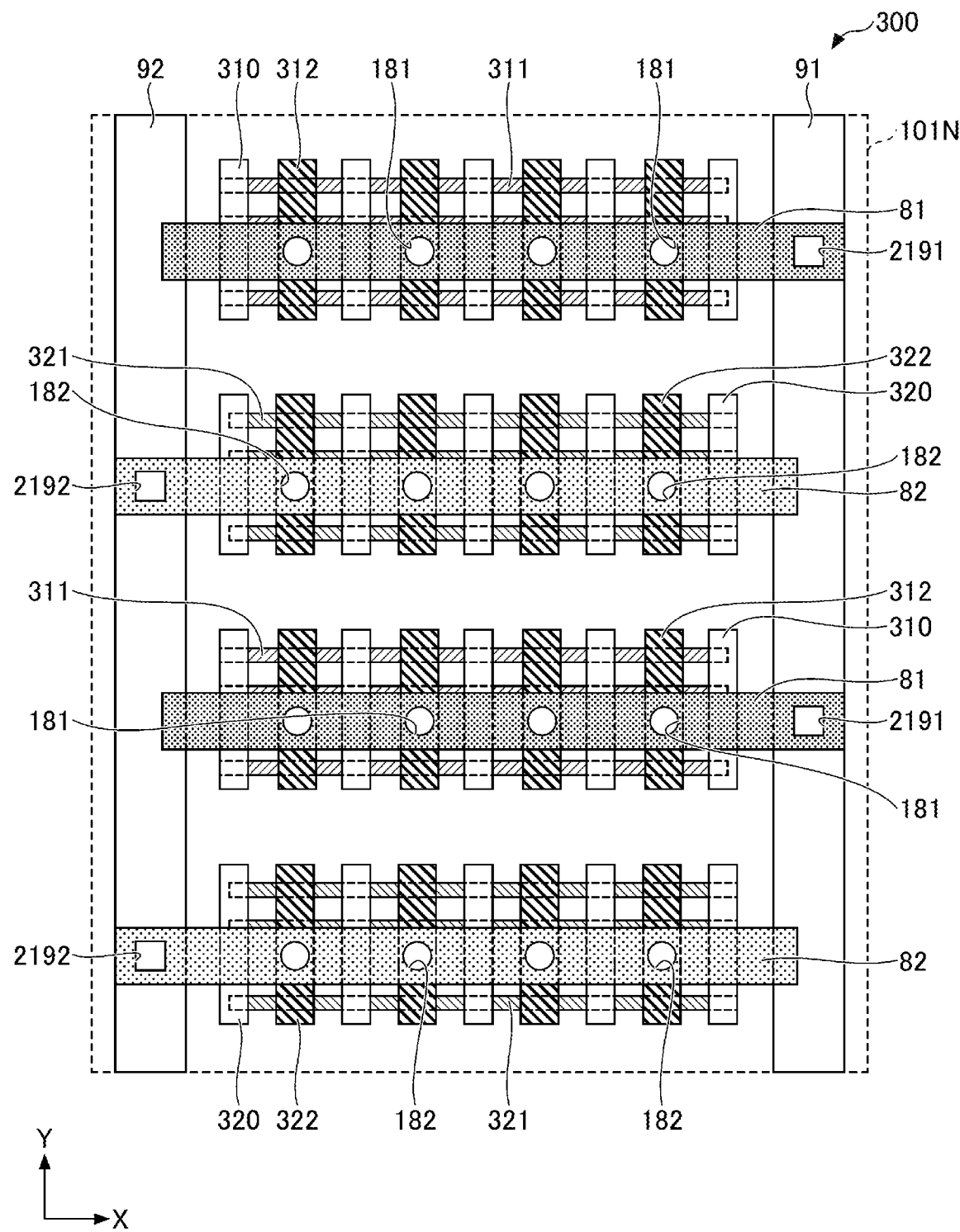
FIG. 10 is a diagram schematically depicting a planar configuration of another diode according to the second embodiment.

Next, a second embodiment will be described. The second embodiment differs mainly from the first embodiment in the extending direction of the power supply wiring. FIG. 9 is a schematic diagram showing a planar configuration of the diode 200 according to the second embodiment. FIG. 10 is a schematic diagram showing a planar configuration of the diode 300 according to the second embodiment.

As shown in FIG. 9, in the diode 200, a groove extending in the Y-direction is formed in the P-well 101P and the element separation film 102 and in this groove a power supply wiring 91 is formed via an insulation film 104 (see FIG. 4). In the insulation film 152 (see FIG. 4), a contact hole 181 reaching the local wiring 212 is formed. A power supply wiring 81 is formed in the insulation film 153 that extends in the X-direction and is connected to the local wiring 212 through a conductor in the contact hole 181. A contact hole 2191 is formed between the power supply wiring 81 and the power supply wiring 91 in the insulation films 152 and 151 (see FIG. 4), and the power supply wiring 81 is connected to the power supply wiring 91 through a conductor in the contact hole 2191. At the position where the contact hole 2191 is formed, a local wiring, and a contact hole that connects the local wiring to the power supply wiring 81 and the power supply wiring 91 may be formed.

Moreover, in the diode 200, another groove extending in the Y-direction is formed in the P-well 101P and the element separation film 102, and in this groove a power supply wiring 92 is formed via the insulation film 104 (see FIG. 4). In the insulation film 152 (see FIG. 4), a contact hole 182 reaching the local wiring 222 is formed. A power supply wiring 82 is formed in the insulation film 153 (see FIG. 4) extending in the X-direction and connected to the local wiring 222 through a conductor in the contact hole 182. A contact hole 2192 is formed in the insulation films 152 and 151 (see FIG. 4) between the power supply wiring 82 and the power supply wiring 92. The power supply wiring 82 is connected to the power supply wiring 92 through a conductor in the contact hole 2192. At the position where the contact hole 2192 is formed, a local wiring, and a contact hole that connects the local wiring to the power supply wiring 82 and the power supply wiring 92 may be formed.

In the second embodiment, the diode 200 includes two sets each including four N-type fins 211, four local wirings 212, four contact holes 181, five dummy-gate electrodes 210, and one power supply wiring 81. Moreover, the diode 200 includes two sets each including four P-type fins 221, four local wirings 222, four contact holes 182, five dummy-gate electrodes 220, and one power supply wiring 82.

As shown in FIG. 10, in the diode 300, a groove extending in the Y-direction is formed in the N-well 101N and the element separation film 102 and in this groove a power supply wiring 91 is formed via an insulation film 104 (see FIG. 4). In the insulation film 152 (see FIG. 4), a contact hole 181 reaching the local wiring 312 is formed. A power supply wiring 81 is formed in the insulation film 153 that extends in the X-direction and is connected to the local wiring 312 through a conductor in the contact hole 181. A contact hole 2191 is formed between the power supply wiring 81 and the power supply wiring 91 in the insulation films 152 and 151 (see FIG. 4), and the power supply wiring 81 is connected to the power supply wiring 91 through a conductor in the contact hole 2191. At the position where the contact hole 2191 is formed, a local wiring, and a contact hole that connects the local wiring to the power supply wiring 81 and the power supply wiring 91 may be formed.

Moreover, in the diode 300, another groove extending in the Y-direction is formed in the N-well 101N and the element separation film 102, and in this groove a power supply wiring 92 is formed via an insulation film 104 (see FIG. 4). In the insulation film 152 (see FIG. 4), a contact hole 182 reaching the local wiring 322 is formed. A power supply wiring 82 is formed in the insulation film 153 (see FIG. 4) extending in the X-direction and connected to the local wiring 322 through a conductor in the contact hole 182. A contact hole 2192 is formed in the insulation films 152 and 151 (see FIG. 4) between the power supply wiring 82 and the power supply wiring 92. The power supply wiring 82 is connected to the power supply wiring 92 through a conductor in the contact hole 2192. At the position where the contact hole 2192 is formed, a local wiring, and a contact hole that connects the local wiring to the power supply wiring 82 or the power supply wiring 92 may be formed.

In the second embodiment, the diode 300 includes two sets each including four P-type fins 311, four local wirings 312, four contact holes 181, five dummy-gate electrodes 310, and one power supply wiring 81. Moreover, the diode 300 includes two sets each including four N-type fins 321, four local wirings 322, four contact holes 182, five dummy-gate electrodes 320, and one power supply wiring 82.

Other configurations of the semiconductor device according to the second embodiment are the same as those of the first embodiment.

In the second embodiment, the diode 200 includes the power supply wirings 91 and 92 as buried wirings, and the diode 300 includes the power supply wirings 91 and 92 as buried wirings. Thus, according to the second embodiment, a bidirectional diode including buried wirings can be implemented. Therefore, the configuration of the wirings according to the second embodiment is suitable for further miniaturization of semiconductor devices.

Furthermore, the power supply wiring 91 extending in the Y-direction and the plurality of power supply wirings 81 extending in the X-direction configure a power supply network. Moreover, the power supply wiring 92 extending in the Y-direction and the plurality of power supply wirings 82 extending in the X-direction configure another power supply network. Thus, a current flowing through each of the diodes can be made more uniform. Moreover, compared with the case where the power supply wiring or the signal line configuring the power supply network is formed only above the fins, the uniformity of the current can be improved.

Moreover, at least a part of the power supply wirings extending in the Y-direction and at least a part of the power supply wirings extending in the X-direction may be formed in the substrate 101, to the extent that wirings of different potentials are not connected to each other.

In the other embodiments and variations, the power supply wiring or the signal line may be formed in the substrate 101 so that at least a part of the power supply wirings extends in the Y-direction.

Furthermore, in the diodes 200 and 300, the number of the fins, the dummy-gate electrodes, the local wirings, and sets provided in each diode may be changed accordingly. The above-described numbers may be changed also in the other embodiments and variations in the same manner as above.

Third Embodiment

Figure 11:
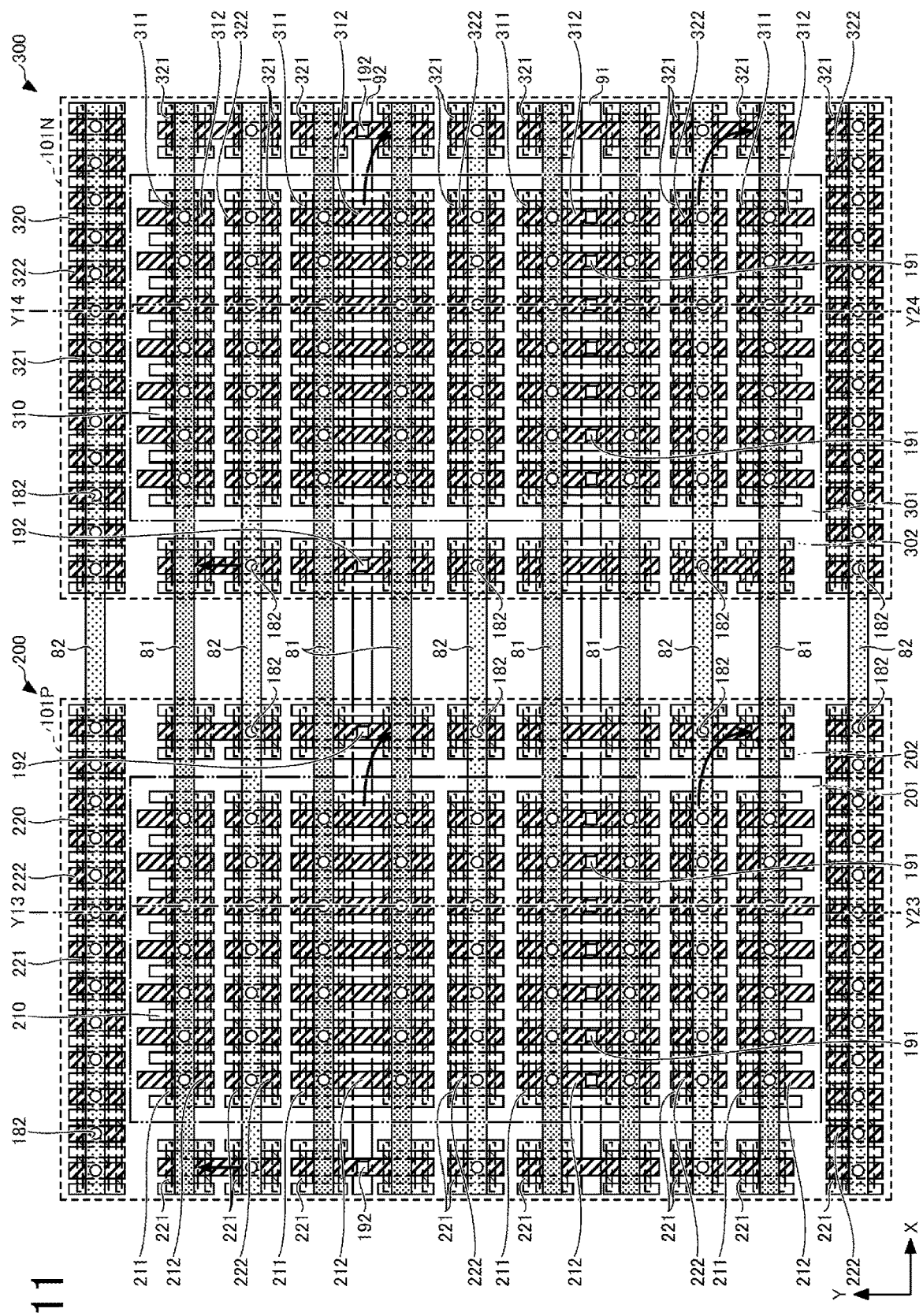
FIG. 11 is a diagram schematically depicting a planar configuration of two diodes according to a third embodiment.
Figure 12:
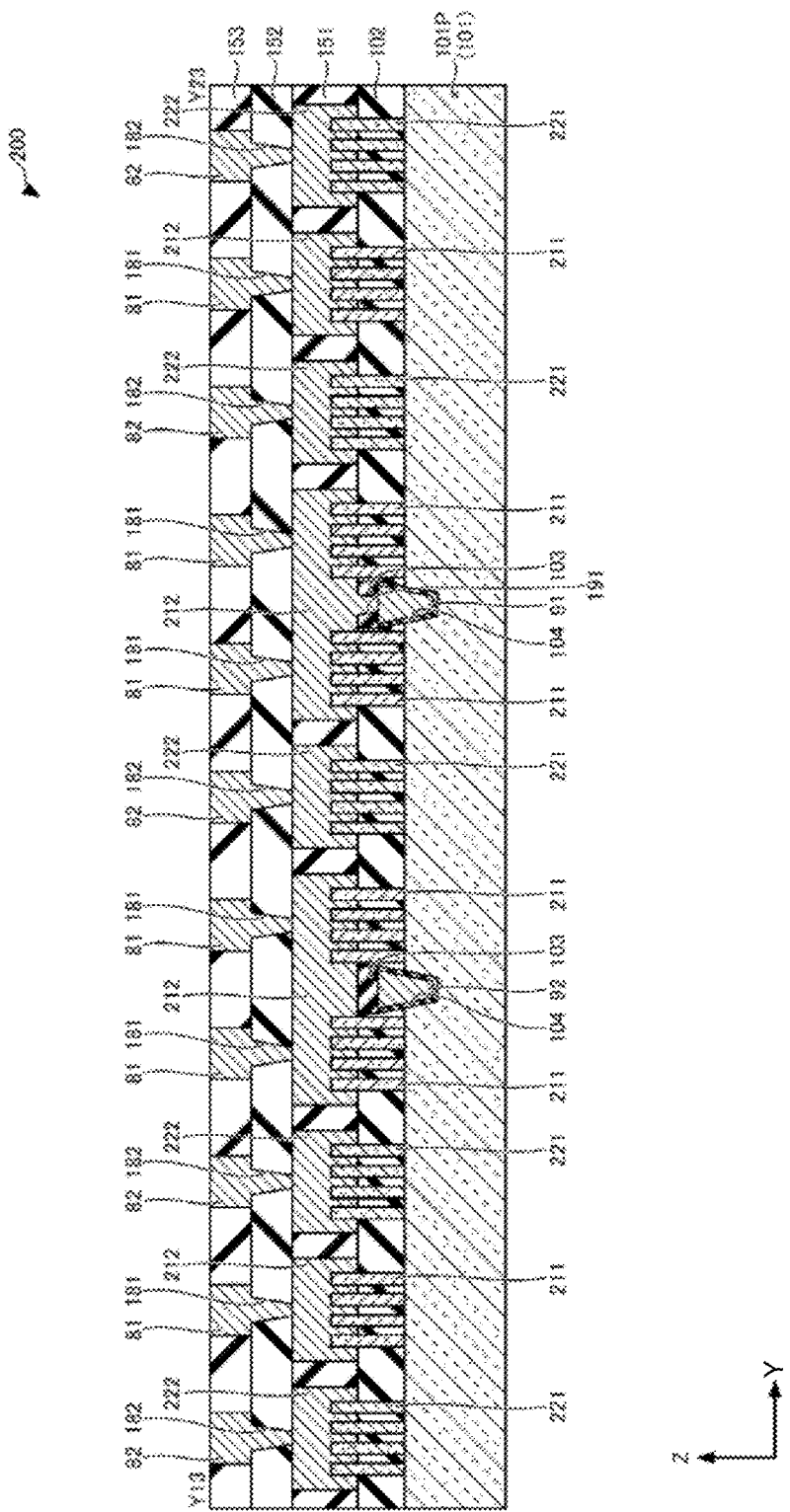
FIG. 12 is a cross-sectional view illustrating one diode according to the third embodiment.
Figure 13:
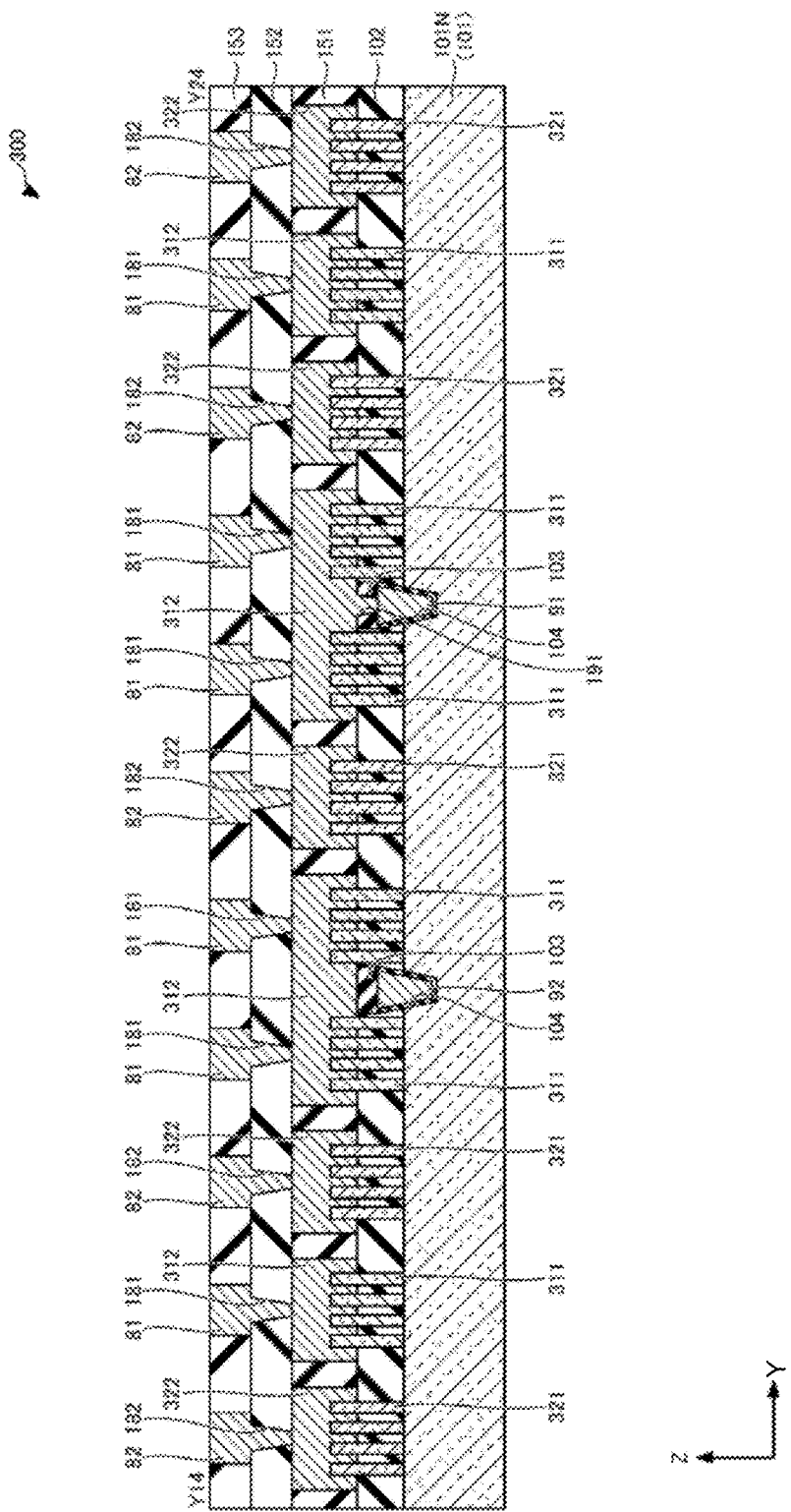
FIG. 13 is a cross-sectional view illustrating another diode according to the third embodiment.

Next, a third embodiment will be described. The third embodiment differs from the first embodiment mainly in the size of the diodes. FIG. 11 is a schematic diagram showing a planar configuration of the diodes 200 and 300 according to the third embodiment. FIG. 12 is a cross-sectional view illustrating the diode 200 according to the third embodiment. FIG. 13 is a cross-sectional view illustrating the diode 300 according to the third embodiment. FIG. 12 is a diagram depicting a cross section cut along a line Y13-Y23 in FIG. 11. FIG. 13 is a diagram depicting a cross section cut along a line Y14-Y24 in FIG. 11.

As shown in FIG. 11, in the third embodiment, the diode 200 and the diode 300 are arranged along the X-direction. Power supply wiring 91 and power supply wiring 92 are commonly provided in the diode 200 and the diode 300.

The diode 200 includes a main portion 201 and a guard ring portion 202 that surrounds the main portion 201 in a plan view.

In the main portion 201, four N-type fins 211, four P-type fins 221, and four N-type fins 211 are provided in this order between the power supply wiring 92 and the power supply wiring 91 in the Y-direction. On the side of the power supply wiring 92 opposite to the power supply wiring 91 in the Y-direction, four N-type fins 211, four P-type fins 221, and four N-type fins 211 are provided in this order. On the side of the power supply wiring 91 opposite to the power supply wiring 92 in the Y-direction, four N-type fins 211, four P-type fins 221, and four N-type fins 211 are provided in this order. In the same manner as in the first embodiment, the local wirings 212 and 222, the dummy-gate electrodes 210 and 220, the contact holes 182 and 191, and the power supply wiring 82 are provided in the main portion 201. Furthermore, as shown in FIG. 12, the contact hole 181 is formed in the insulation film 152 and the power supply wiring 81 is formed in the insulation film 153. The power supply wiring 81 is connected to the local wiring 212 through a conductor in the contact hole 181.

In the guard ring portion 202, the plurality of P-shaped fins 221 are arranged annularly. The guard ring portion 202 also includes a local wiring 222 connected to the P-type fin 221 and a power supply wiring 82 connected to the local wiring 222. A part of the power supply wiring 82 in the guard ring portion 202 may be common to a part of the power supply wiring 82 in the main portion 201.

The diode 300 has a main portion 301 and a guard ring portion 302 that surrounds the main portion 301 in a plan view.

In the main portion 301, four P-type fins 311, four N-type fins 321, and four P-type fins 311 are provided in this order between the power supply wiring 92 and the power supply wiring 91 in the Y-direction. On the side of the power supply wiring 92 opposite to the power supply wiring 91 in the Y-direction, four P-type fins 311, four N-type fins 321, and four P-type fins 311 are provided in this order. On the side of the power supply wiring 91 opposite to the power supply wiring 92 in the Y-direction, four P-type fins 311, four N-type fins 321, and four P-type fins 311 are provided in this order. In the same manner as in the first embodiment, the local wirings 312 and 322, the dummy-gate electrodes 310 and 320, the contact holes 182 and 191, and the power supply wiring 82 are provided in the main portion 201. Furthermore, as shown in FIG. 13, the contact hole 181 is formed in the insulation film 152 and the power supply wiring 81 is formed in the insulation film 153. The power supply wiring 81 is connected to the local wiring 312 through a conductor in the contact hole 181.

In the guard ring portion 302, a plurality of N-shaped fins 321 are arranged annularly. The guard ring portion 302 also includes a local wiring 322 connected to the N-type fin 321 and a power supply wiring 82 connected to the local wiring 322. A part of the power supply wiring 82 in the guard ring portion 302 may be common to a part of the power supply wiring 82 in the main portion 301.

In the third embodiment, the diode 200 includes the power supply wirings 91 and 92 as buried wirings, and the diode 300 includes the power supply wirings 91 and 92 as buried wirings. Thus, according to the third embodiment, a bidirectional diode including buried wiring can be implemented. In addition, according to the third embodiment, since the power supply wiring 81 is connected to the local wirings 212 and 312 to which the power supply wiring 91 is connected, causing electric current to flow through the diodes 200 and 300 can be facilitated.

Moreover, a part of the power supply wiring 92 is formed in the P-well 101P, and the VSS2 power supply potential is supplied to both the power supply wiring 92 and the P-well 101P. Thus, the parasitic capacitance between a part of the power supply wiring 92 and the P-well 101P can be reduced.

Similarly, a part of the power supply wiring 91 is formed in the N-well 101N, and the VSS1 power supply potential is supplied to both the power supply wiring 91 and the N-well 101N. Thus, the parasitic capacitance between a part of the power supply wiring 91 and the N-well 101N can be reduced.

Moreover, in a part of the guard ring portion 202, the local wiring 222 is shared between adjacent groups of four P-type fins 221. Therefore, as indicated by arrows in FIG. 11, the VSS2 power supply potential supplied from the power supply wiring 82 to the local wiring 222 can be applied to the two groups. Accordingly, even if the P-type fin 221 overlaps with the power supply wiring 81 in the thickness direction, the P-type fin 221 can be supplied with the VSS power supply potential. Similarly, in a part of the guard ring portion 302, the local wiring 322 is shared between adjacent groups of four N-type fins 321. Thus, as indicated by arrows in FIG. 11, the VSS2 power supply potential supplied from the power supply wiring 82 to the local wiring 322 can be applied to the two groups. Thus, even if the N-type fins 321 overlap with the power supply wiring 81 in the thickness direction, the N-type fins 321 can be supplied with the VSS2 power supply potential. The above-described configurations may be applied to the other embodiments and variations.

Moreover, since the diode 200 includes the guard ring portion 202 and the diode 300 includes the guard ring portion 302, leakage of current from the main portions 201 and 301 to the outside can be suppressed.

The position of the power supply wirings 91 and 92 in a plan view is not limited to between the N-type fins 211 in the diode 200 or between the P-type fins 311 in the diode 300. For example, the power supply wirings 91 and 92 may be provided between the N-type fin 211 and the P-type fin 221 in the diode 200, or the power supply wirings 91 and 92 may be provided between the P-type fin 311 and the N-type fin 321 in the diode 300. The same applies to other embodiments and variations.

First Variation of the Third Embodiment

Figure 14:
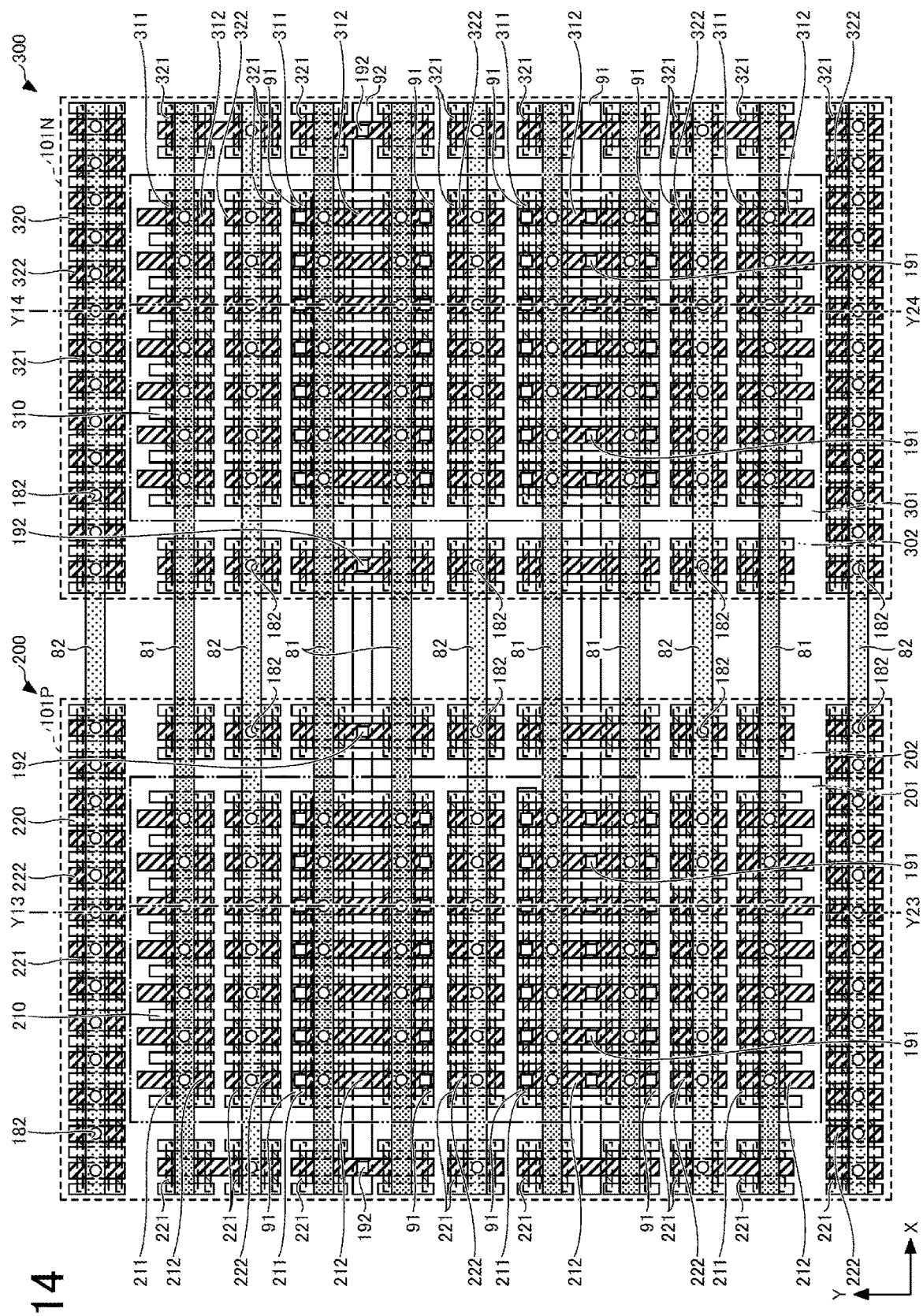
FIG. 14 is a diagram schematically depicting a planar configuration of two diodes according to a first variation of the third embodiment.

Next, a first variation of the third embodiment will be described. The first variation of the third embodiment is different from the third embodiment mainly in the number of fins. FIG. 14 is a schematic diagram showing a planar configuration of the diodes 200 and 300 according to the first variation of the third embodiment.

As shown in FIG. 14, in the first variation, in the main portion 201 of the diode 200, two N-type fins 211, four P-type fins 221, and two N-type fins 211 are provided in this order between the power supply wiring 92 and the power supply wiring 91 in the Y-direction. In the Y-direction, two N-type fins 211, four P-type fins 221, and four N-type fins 211 are provided in this order on the side of the power supply wiring 92 opposite to the power supply wiring 91 in this order. In the Y-direction, two N-type fins 211, four P-type fins 221, and four N-type fins 211 are provided in this order on the side of the power supply wiring 91 opposite to the power supply wiring 92.

The power supply wiring 91 is formed below both ends of the local wiring 212 extending in the Y-direction from the power supply wiring 92 in a plan view. The ends of the local wiring 212 are connected to the power supply wiring 91 through a conductor in the contact hole 191 formed in the insulation film 103 (see FIG. 12). Further, the power supply wiring 91 is formed below both ends of the local wiring 212 extending in the Y-direction from the power supply wiring 91 in a plan view. The ends of the local wiring 212 are connected to the power supply wiring 91 through a conductor in the contact hole 191 formed in the insulation film 103 (see FIG. 12).

In the main portion 301 of the diode 300, two P-type fins 311, four N-type fins 321, and two P-type fins 311 are provided in this order between the power supply wiring 92 and the power supply wiring 91 in the Y-direction. In the Y-direction, two P-type fins 311, four N-type fins 321, and four P-type fins 311 are provided in this order on the side of the power supply wiring 92 opposite to the power supply wiring 91. In the Y-direction, two P-type fins 311, four N-type fins 321, and four P-type fins 311 are provided in this order on the side of the power supply wiring 91 opposite to the power supply wiring 92.

The power supply wiring 91 is formed below both ends of the local wiring 312 extending in the Y-direction from the power supply wiring 92 in a plan view. The ends of the local wiring 312 are connected to the power supply wiring 91 through a conductor in the contact hole 191 formed in the insulation film 103 (see FIG. 13). Further, the power supply wiring 91 is formed below both ends of the local wiring 312 extending in the Y-direction from the power supply wiring 91 in a plan view. The ends of the local wiring 312 are connected to the power supply wiring 91 through a conductor in the contact hole 191 formed in the insulation film 103 (see FIG. 13).

Other configurations of the semiconductor device according to the first variation of the third embodiment are the same as those of the third embodiment.

According to the first variation of the third embodiment, the same effect as the third embodiment can be obtained. Additionally, in the first variation, the local wiring 212 connected to the power supply wiring 81 is also connected to the power supply wiring 91 in the diode 200, and the local wiring 312 connected to the power supply wiring 81 is also connected to the power supply wiring 91 in the diode 300. Thus, it is possible to reduce an electric resistance of a wiring connected to the first VSS pad 31.

As in the first variation of the third embodiment, a number of fins of the same conductive type located nearest to the buried wirings, i.e. the power supply wirings 91 and 92, in the present embodiment, and a number of fins of different conductive type located next to the fins of the same conductive type may be different. For example, the number of fins of the same conductive type may be less than the number of fins of the different conductive type. In addition, a buried wiring may be provided on the side of the smaller number of fins.

A number of fins in the guard ring portion 202 or 302 may correspond to the number of fins in the main portion 201 or 301. For example, the number of fins in the guard ring portion 202 or 302 may be reduced so as to correspond to a part of the main portion 201 or 301 having a small number of fins. In this case, it is possible to reduce the size of the circuit, and the semiconductor device is miniaturized easily.

Second Variation of the Third Embodiment

Figure 15:
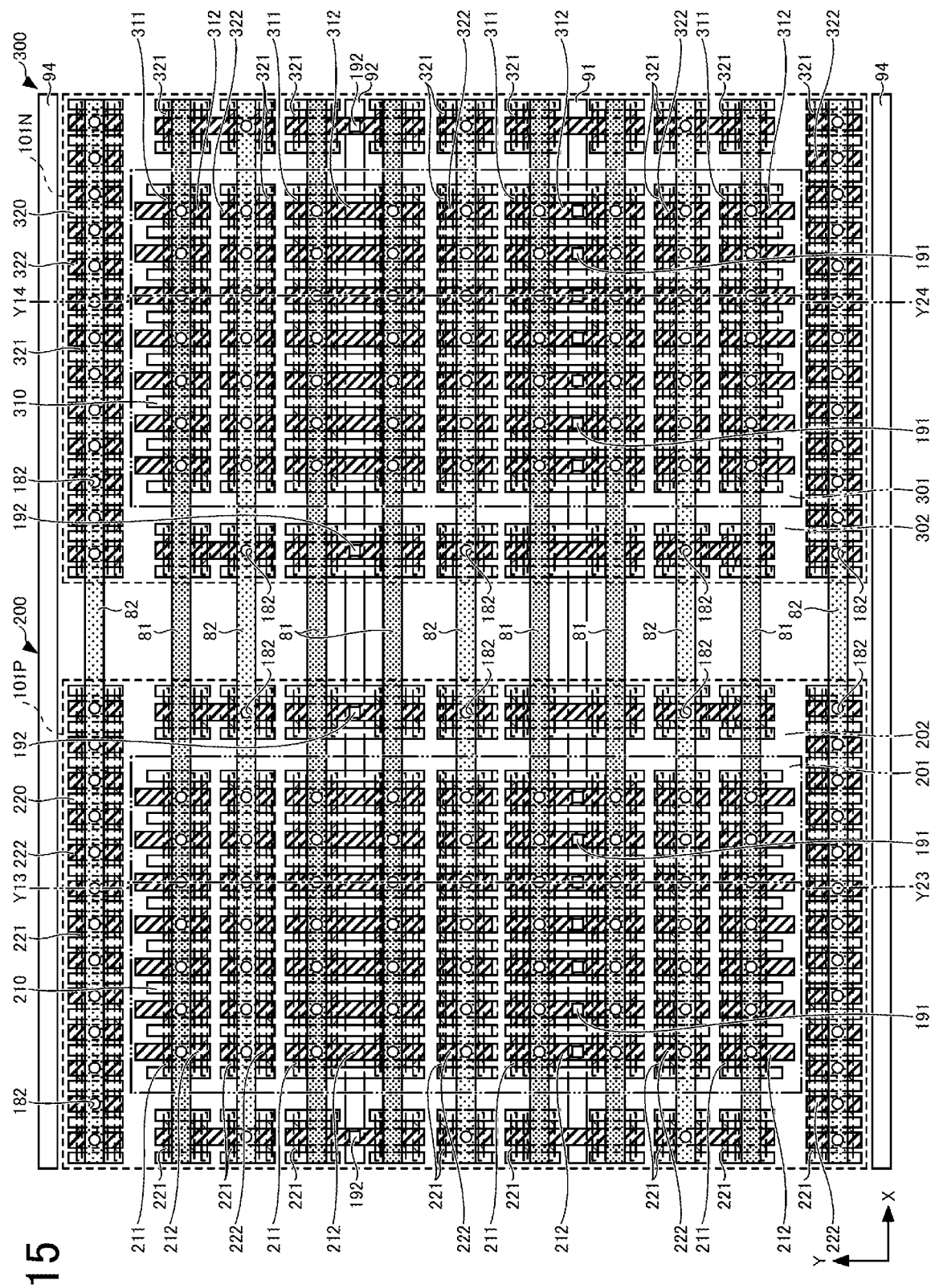
FIG. 15 is a diagram schematically depicting a planar configuration of two diodes according to a second variation of the third embodiment.

Next, a second variation of the third embodiment will be described. The second variation differs from the third embodiment mainly in that a dummy wiring is provided outside the guard ring portions 202 and 302. FIG. 15 is a schematic diagram showing a planar configuration of diodes 200 and 300 according to the second variation of the third embodiment.

As shown in FIG. 15, in the second variation, a groove extending in the X-direction is formed in the substrate 101 and the element separation film 102 (see FIGS. 12 and 13) outside the guard ring portions 202 and 302 in the Y-direction, and a dummy-wiring 94 is formed in the groove via the insulation film 104 (see FIGS. 12 and 13). For example, the surface of the dummy-wiring 94 is covered by an insulation film 103. For example, the surface of the element separation film 102 and the surface of the insulation film 103 may be flush with or may not be flush with the surface of the substrate 101. For example, the dummy-wiring 94 is in an electrically floating state.

Other configurations of the semiconductor device according to the second variation of the third embodiment are the same as those of the third embodiment.

According to the second variation of the third embodiment, the same effect as the third embodiment can be obtained. Additionally, in the second variation, dispersion in the density of the buried wirings can be reduced in the manufacturing process, to suppress an occurrence of variation in dimension.

The dummy-wiring 94 may be provided in the guard ring portion 202 and the guard ring portion 302.

In the other embodiments and variations, the dummy-wiring 94 may be provided.

Third Variation of the Third Embodiment

Figure 16:
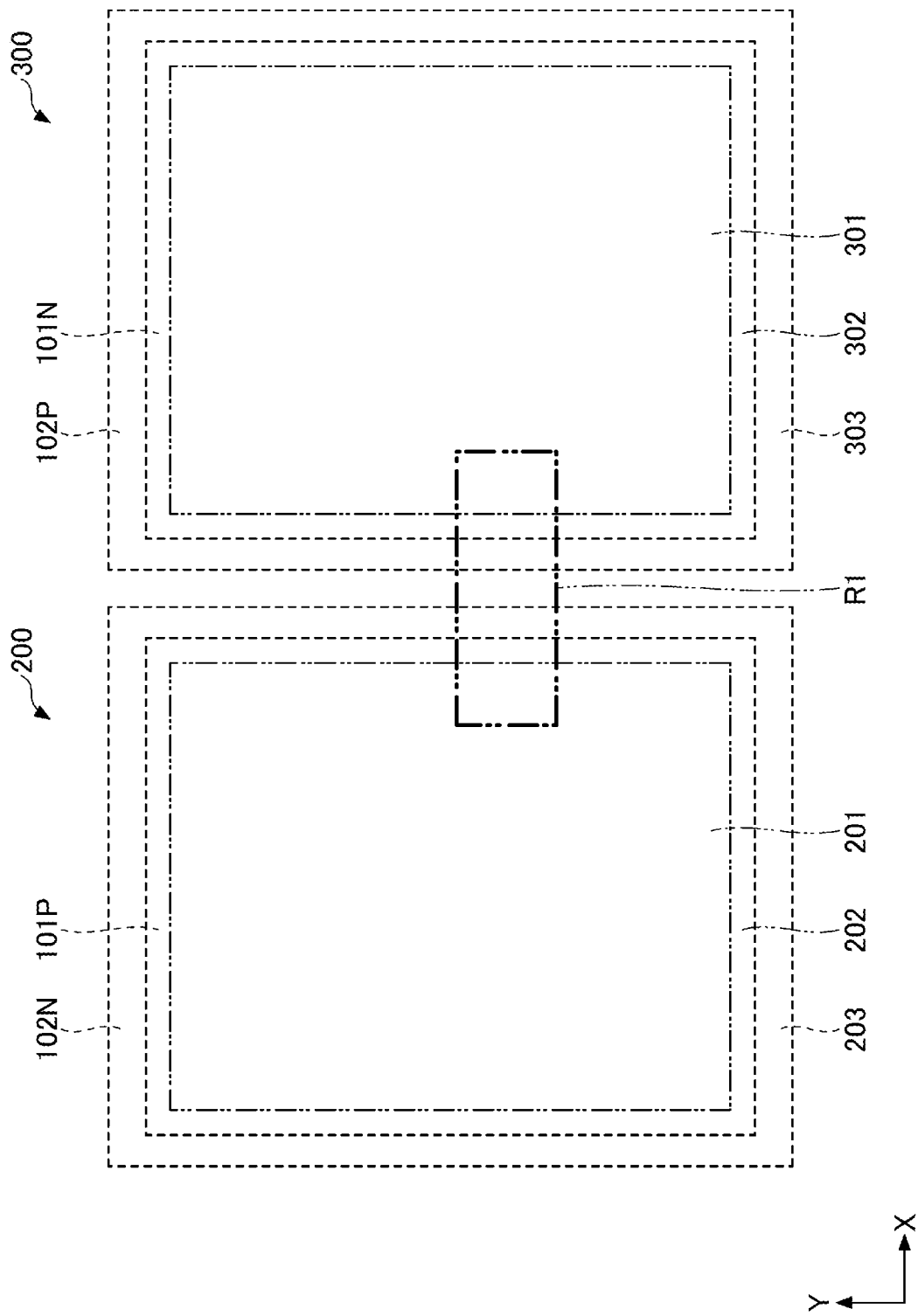
FIG. 16 is a diagram schematically depicting two diodes according to a third variation of the third embodiment.
Figure 17:
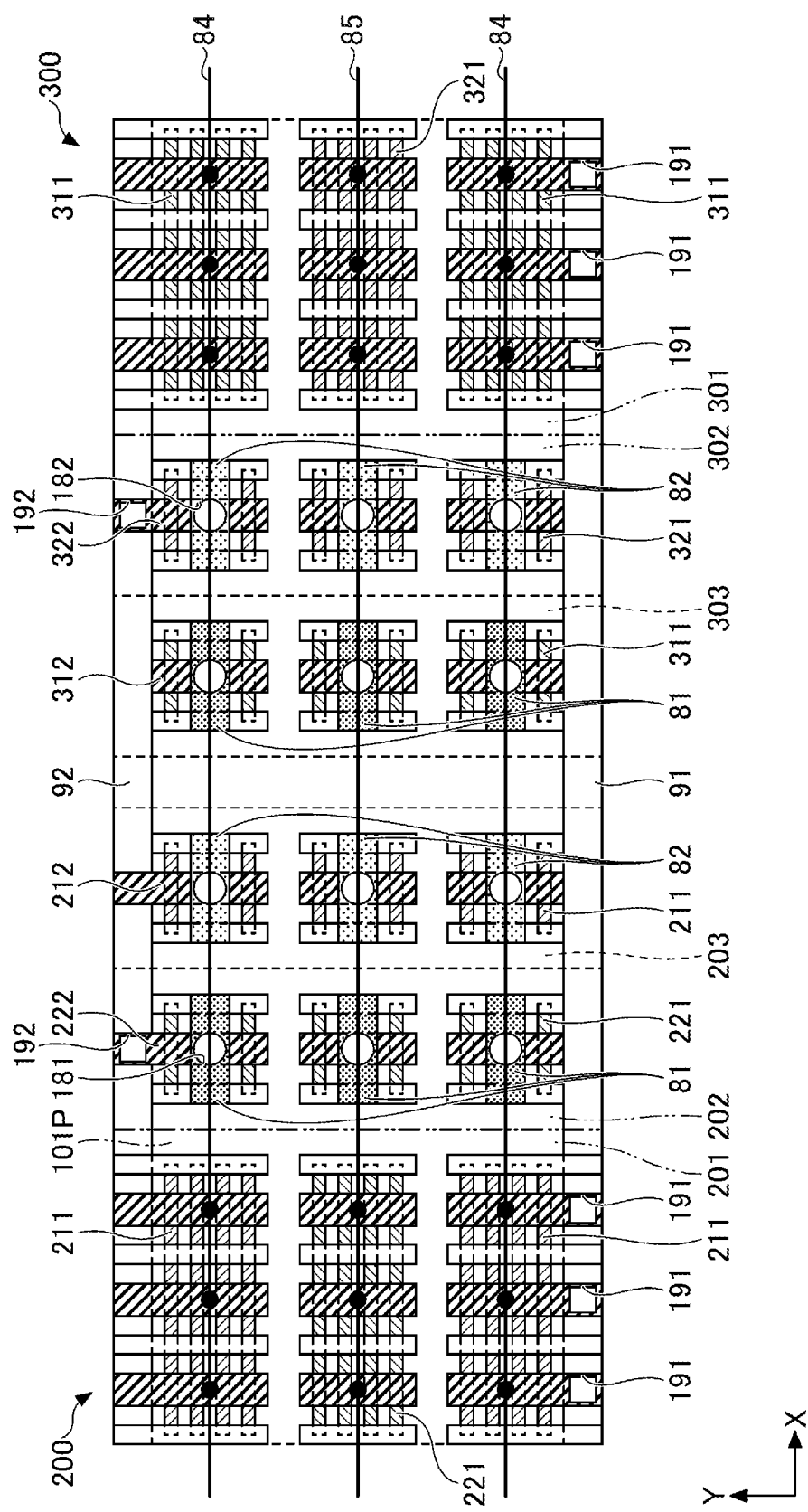
FIG. 17 is an enlarged view of a main portion of the configuration according to the third variation of the third embodiment.

Next, a third variation of the third embodiment will be described. The third variation differs from the third embodiment mainly in that the guard ring portions are provided in a multiple way. FIG. 16 is a schematic diagram illustrating the diodes 200 and 300 according to the third variation of the third embodiment. FIG. 17 is an enlarged view of a main part of the configuration according to the third variation of the third embodiment. FIG. 17 corresponds to a region R1, which is indicated by using dashed double-dotted lines in FIG. 16.

As shown in FIG. 16, in the third variation, the diode 200 includes a main portion 201 and a guard ring portion 202 provided in the P-well 101P and a guard ring portion 203 provided in the N-well 102N around the guard ring portion 202. Moreover, the diode 300 includes a main portion 301 and a guard ring portion 302 provided in the N-well 101N and a guard ring portion 303 provided in the P-well 102P around the guard ring portion 302.

As shown in FIG. 17, a plurality of N-type fins 211 are arranged annularly in the guard ring portion 203. Moreover, the guard ring portion 203 also includes the local wiring 212 connected to the N-type fin 211 and the power supply wiring 82 connected to the local wiring 212. A plurality of P-type fins 311 are arranged annularly in the guard ring portion 303. Moreover, the guard ring portion 303 includes the local wiring 312 connected to the P-type fin 311 and the power supply wiring 81 connected to the local wiring 312.

The local wiring 212 in the main portion 201 and the local wiring 312 in the main portion 301 are connected to each other via the power supply wiring 84 extending in the X-direction. The local wiring 222 in the main portion 201 and the local wiring 322 in the main portion 301 are connected to each other via the power supply wiring 85 extending in the X-direction. The power supply wirings 84 and 85 are provided, for example, above the insulation film 153.

Other configurations of the semiconductor device according to the third variation of the third embodiment are the same as those of the third embodiment.

According to the third variation of the third embodiment, the same effect as the third embodiment can be obtained.

Furthermore, because the guard ring portions 203 and 303 are provided, leakage of current from the main portions 201 and 301 to the outside can be reduced. Three or more guard ring portions may be formed.

The dummy-wiring 94 of the second variation may be provided between the guard ring portion 202 and the guard ring portion 203. The other dummy-wiring 94 may also be provided outside the guard ring portion 203. Similarly, the dummy-wiring 94 may be provided between the guard ring portion 302 and the guard ring portion 303. The other dummy-wiring 94 may be provided outside the guard ring portion 303.

In the other embodiments and variations, multiple guard ring portions may be provided, and the dummy-wiring 94 may be provided between or outside the multiple guard ring portions.

Fourth Variation of the Third Embodiment

Figure 18:
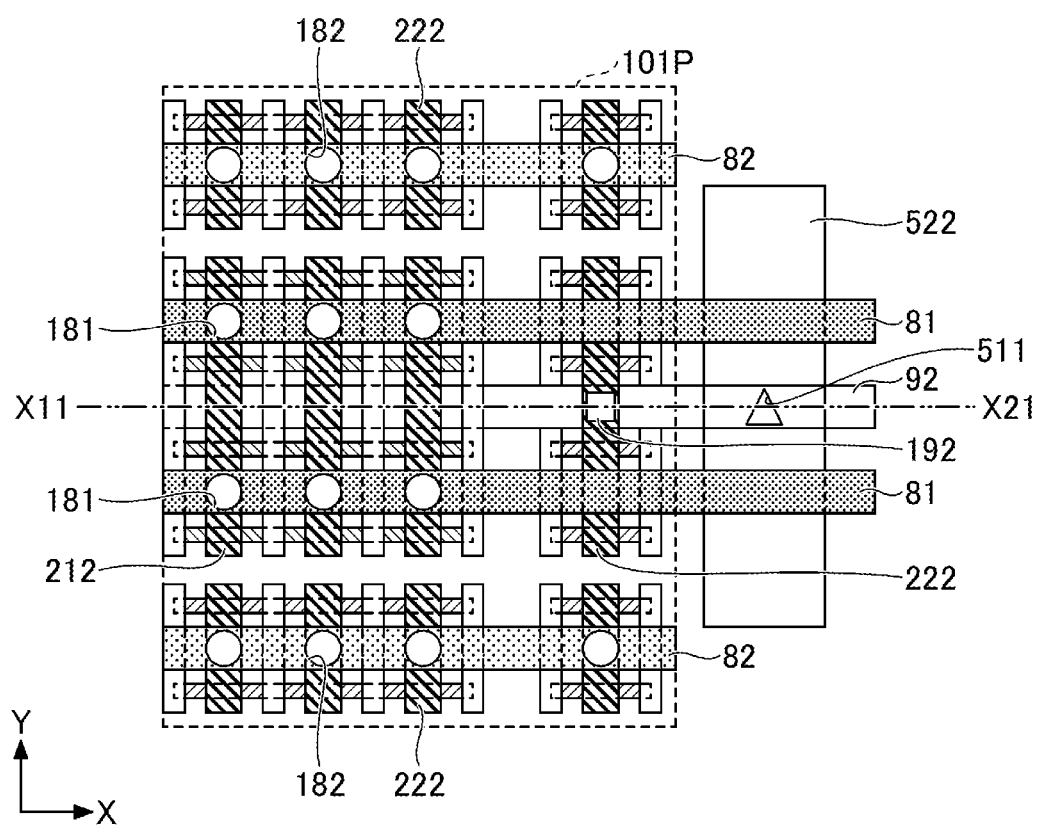
FIG. 18 is a diagram schematically depicting a supply section of a power supply potential to a power supply wiring according to a fourth variation of the third embodiment.
Figure 19:
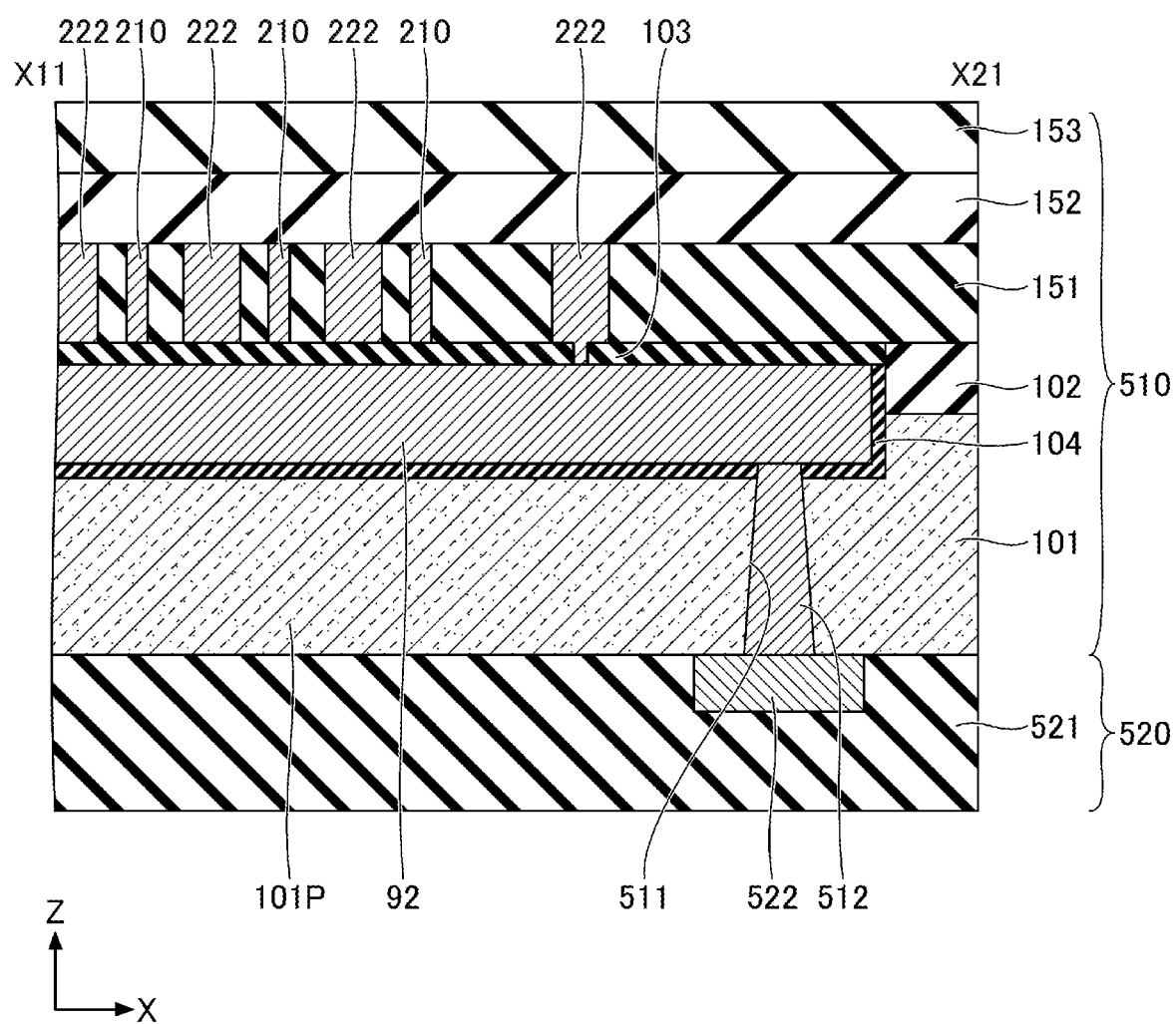
FIG. 19 is a cross-sectional view illustrating the supply section of the power supply potential to the power supply wiring according to the fourth variation of the third embodiment.

Next, a fourth variation of the third embodiment will be described. The fourth variation of the third embodiment differs from the third embodiment mainly in the structure for supplying the power supply potential to the power supply wiring. FIG. 18 is a schematic diagram showing a supply unit for supplying a power supply potential to the power supply wiring 92 according to the fourth variation of the third embodiment. FIG. 19 is a cross-sectional view illustrating the supply unit for supplying a power supply potential to the power supply wiring 92 according to a fourth variation of the third embodiment. FIG. 19 corresponds to a cross section cut along a line X11-X21 in FIG. 18.

As shown in FIGS. 18 and 19, the semiconductor device according to the fourth variation includes a first semiconductor chip 510 and a second semiconductor chip 520.

The first semiconductor chip 510 has the same configuration as that of the third embodiment, except the following features. In the first semiconductor chip 510, outside the guard ring portion 202, a via hole 511 is formed in the substrate 101 from a rear surface of the substrate reaching the power supply wiring 92. A through via 512 is buried in the via hole. Moreover, outside the guard ring portion 202, aa via hole is formed in the substrate 101 from the rear surface of the substrate reaching the power supply wiring 91, and a through via is buried in the via hole (not shown). The first semiconductor chip 510 has the same configuration as that of the second variation of the third embodiment, except for the above-described features.

The second semiconductor chip 520 has an insulation film 521 formed on a substrate (not shown) and a power supply wiring 522 provided on the surface of the insulation film 521. The VSS2 power supply potential is supplied to the power supply wiring 522. To the surface of the insulation film 521 the VSS1 power supply potential is supplied, and a power supply wiring (not shown) connected to the diode 200 is provided on the surface of the insulation film 521.

The diode 300 also has the above-described configuration, i.e. outside the guard ring portion 302, in the substrate 101, a via hole reaching the power supply wiring 91 and a via hole reaching the power supply wiring 92 are formed from the rear surface of the substrate 101, and a through via is buried in the via holes (not shown).

Moreover, the second semiconductor chip 520 includes a power supply wiring, to which the VSS1 power supply potential is supplied and connected to the diode 300, and a power supply wiring, to which the VSS2 power supply potential is supplied and connected to the diode 300, on the surface of the insulation film 521.

Then, the first semiconductor chip 510 and the second semiconductor chip 520 are bonded to each other so that in the diode 200 the power supply wiring 522 is connected to the through via 512 and a power supply wiring, to which the VSS1 power supply potential is supplied, is connected to the through via connected to the power supply wiring 91. In the diode 300, a power supply wiring, to which the VSS2 power supply potential is supplied, is connected to the through via connected to the power supply wiring 92, and a power supply wiring, to which the VSS1 power supply potential is supplied, is connected to the through via connected to the power supply wiring 91.

According to the fourth variation of the third embodiment, the VSS2 power supply potential can be supplied to the power supply wiring 92 of the diode 200 from the power supply wiring 522 of the second semiconductor chip 520 through the through via 512. The VSS1 power supply potential can be supplied to the power supply wiring 91 of the diode 200 from a power supply wiring of the second semiconductor chip 520 through a through via. The VSS2 power supply potential can be supplied to the power supply wiring 92 of the diode 300 from a power supply wiring of the second semiconductor chip 520 through a through via. The VSS1 power supply potential can be supplied to the power supply wiring 91 of the diode 300 from a power supply wiring of the second semiconductor chip 520 through a through via. Furthermore, the VDD power supply potential can be supplied to the power supply wiring 92 of the diode 300 from a power supply wiring of the second semiconductor chip 520 through a through via.

According to the fourth variation of the third embodiment, the same effect as the third embodiment can be obtained. Additionally, because the power supply wirings 81 and 82 provided in the first semiconductor chip 510 can be reduced, the degree of freedom of the layout of the wiring layer can be improved.

In the other embodiments and variations, the second semiconductor chip 520 may be used to route a power supply wiring.

Fourth Embodiment

Next, a fourth embodiment will be described. The fourth embodiment differs from the first embodiment mainly in the structure of arrangement of the fins.

Figure 20:
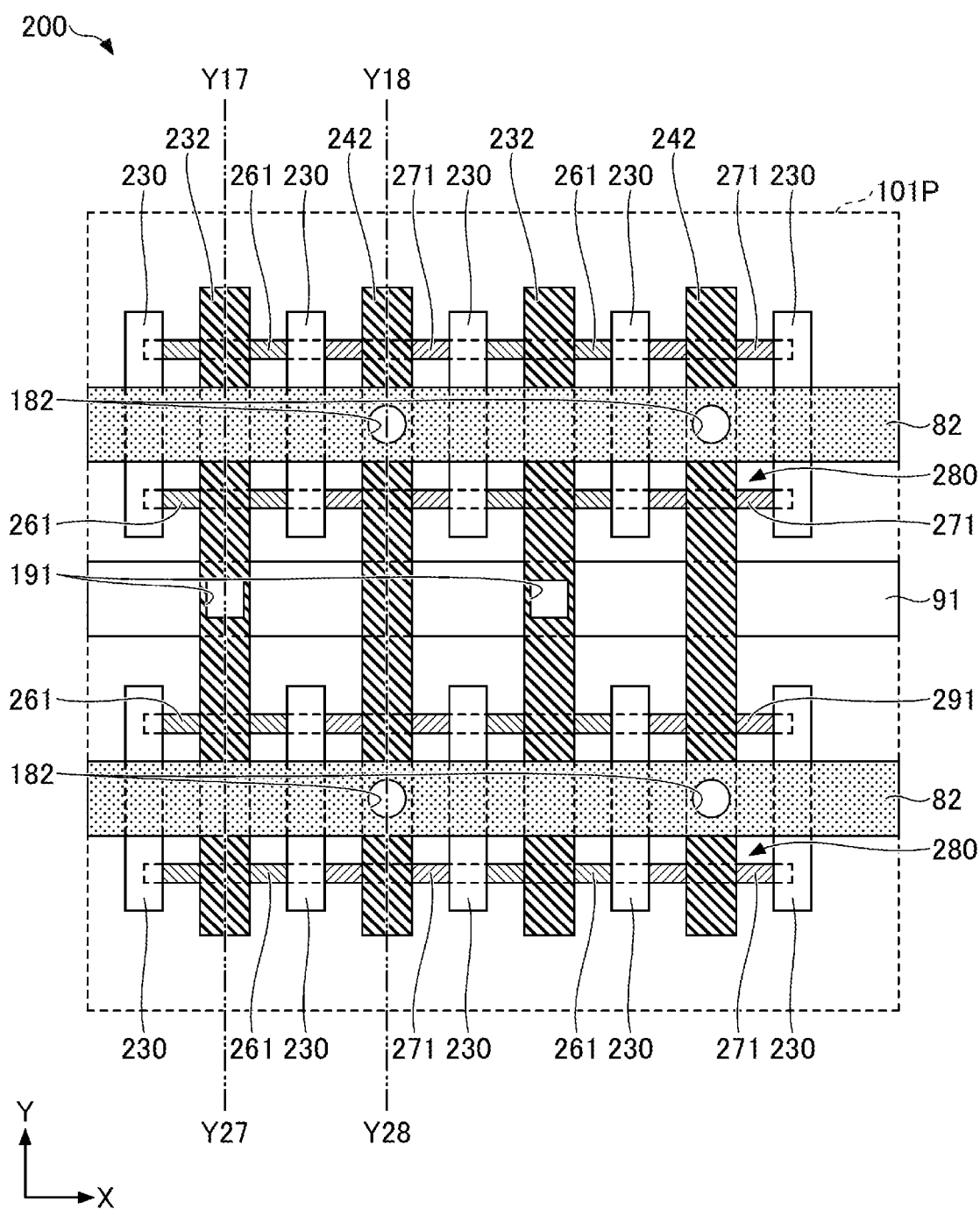
FIG. 20 is a diagram schematically depicting a planar configuration of one diode according to a fourth embodiment.
Figure 21:
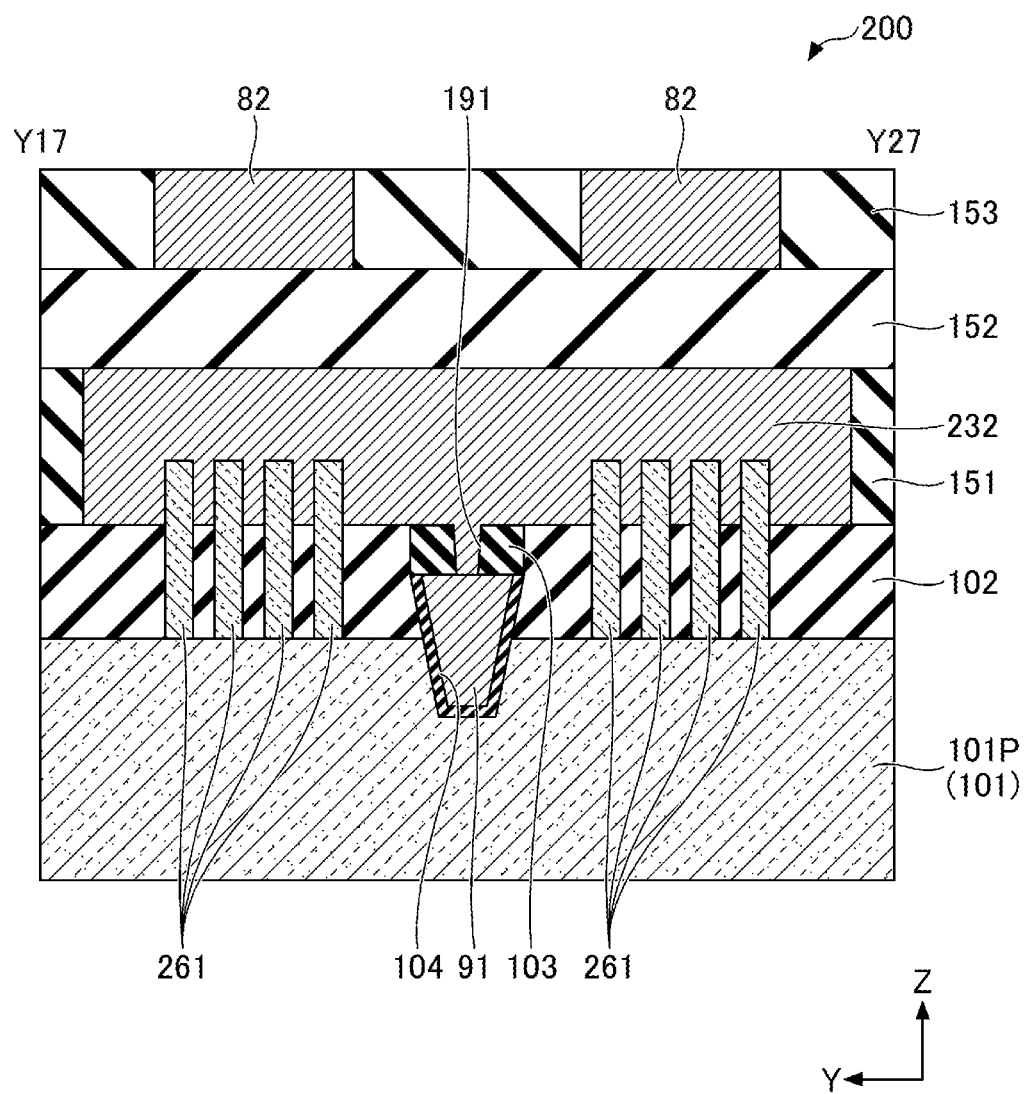
FIG. 21 is a first cross-sectional view illustrating the one diode according to the fourth embodiment.
Figure 22:
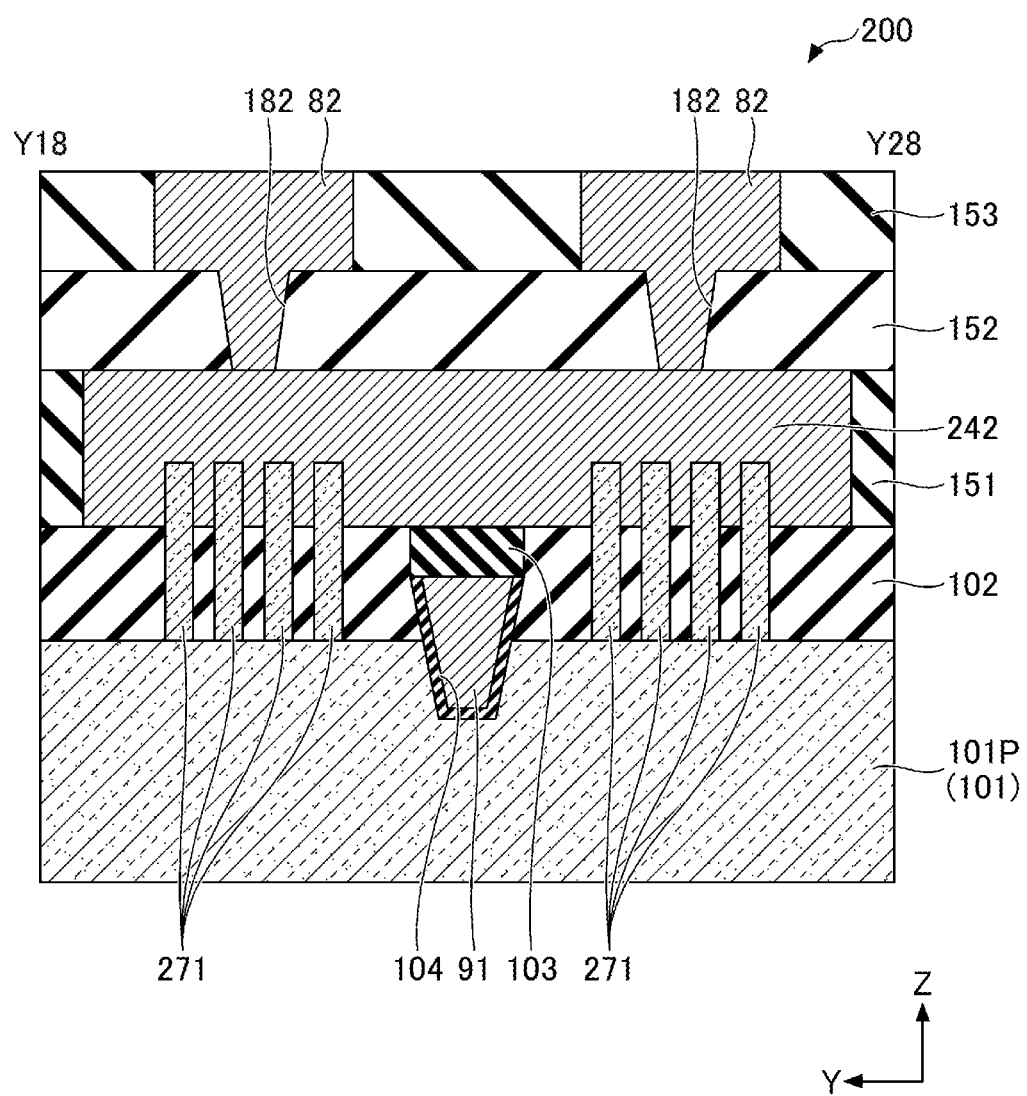
FIG. 22 is a second cross-sectional view illustrating the one diode according to the fourth embodiment.

First, a configuration of the diode 200 according to the fourth embodiment will be described. FIG. 20 is a schematic diagram showing the planar configuration of the diode 200 according to the fourth embodiment. FIGS. 21 and 22 are cross-sectional views showing the diode 200 according to the fourth embodiment. FIG. 21 corresponds to a cross section cut along a line Y17-Y27 in FIG. 20. FIG. 22 corresponds to a cross section cut along a line Y18-Y28 in FIG. 20.

As shown in FIGS. 20 to 22, in the same manner as in the first embodiment, a power supply wiring 91 extending in the X-direction is formed. A plurality of fins 280 extending in the X-direction and standing in the Z-direction are formed on the exposed P-well 101P from the element separation film 102 on both sides of the power supply wiring 91 in the Y-direction. In the embodiment, four fins 280 are formed on both sides of the power supply wiring 91, respectively. Each fin 280 includes a plurality of (in the embodiment, two) N-type regions 261 and a plurality of (in the embodiment, two) P-type regions 271, which are alternatingly arranged. The N-type regions 261 of each fin 280 are aligned in the Y-direction, and the P-type regions 271 of each fin 280 are aligned in the Y-direction.

A plurality of local wirings 232 extending in the Y-direction and connected to each N-type region 261 are formed on the element separation film 102. In the embodiment, two local wirings 232 are formed. A plurality of local wirings 242 extending in the Y-direction and connected to each P-type region 271 are formed on the element separation film 102. In the embodiment, two local wirings 242 are formed. A plurality of dummy-gate electrodes 230, such as so-called fin transistor gate electrodes, are formed so as to be arranged in the X-direction with the local wiring 232 or 242 interposed therebetween. Each of the dummy-gate electrodes 230 extends in the Y-direction. A dummy-gate insulation film (not shown) is formed between the dummy-gate electrode 230 and the fin 280.

As shown in FIGS. 20 and 21, a contact hole 191 is formed in the insulation film 103 between the local wiring 232 and the power supply wiring 91, and the local wiring 232 is connected to the power supply wiring 91 through a conductor in the contact hole 191.

As shown in FIGS. 20 and 22, a contact hole 182 reaching the local wiring 242 is formed in the insulation film 152. In the insulation film 153, a power supply wiring 82 which extends in the X-direction and is connected to the local wiring 242 through a conductor in the contact hole 182 is formed.

Figure 23:
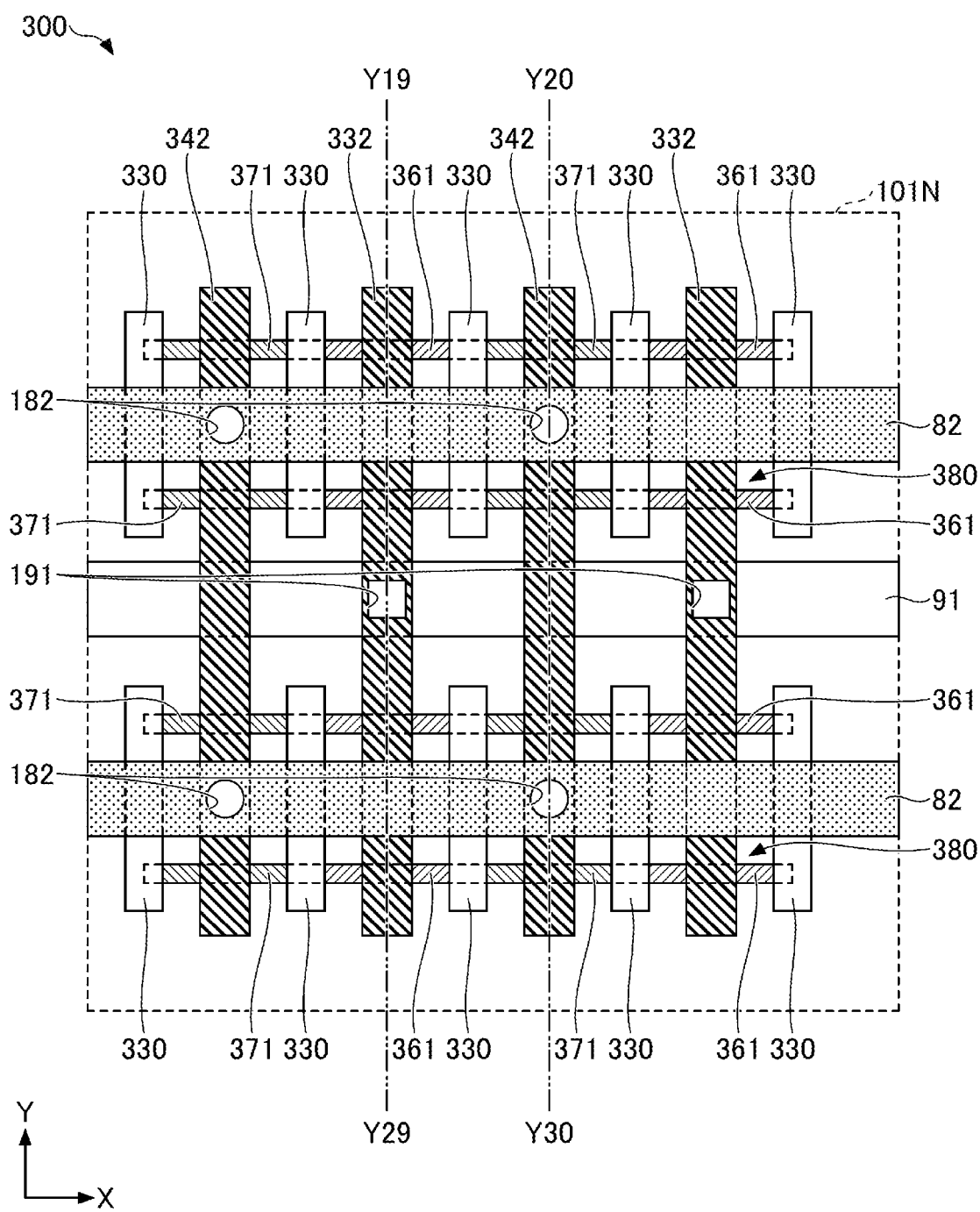
FIG. 23 is a diagram schematically depicting a planar configuration of another diode according to a fourth embodiment.
Figure 24:
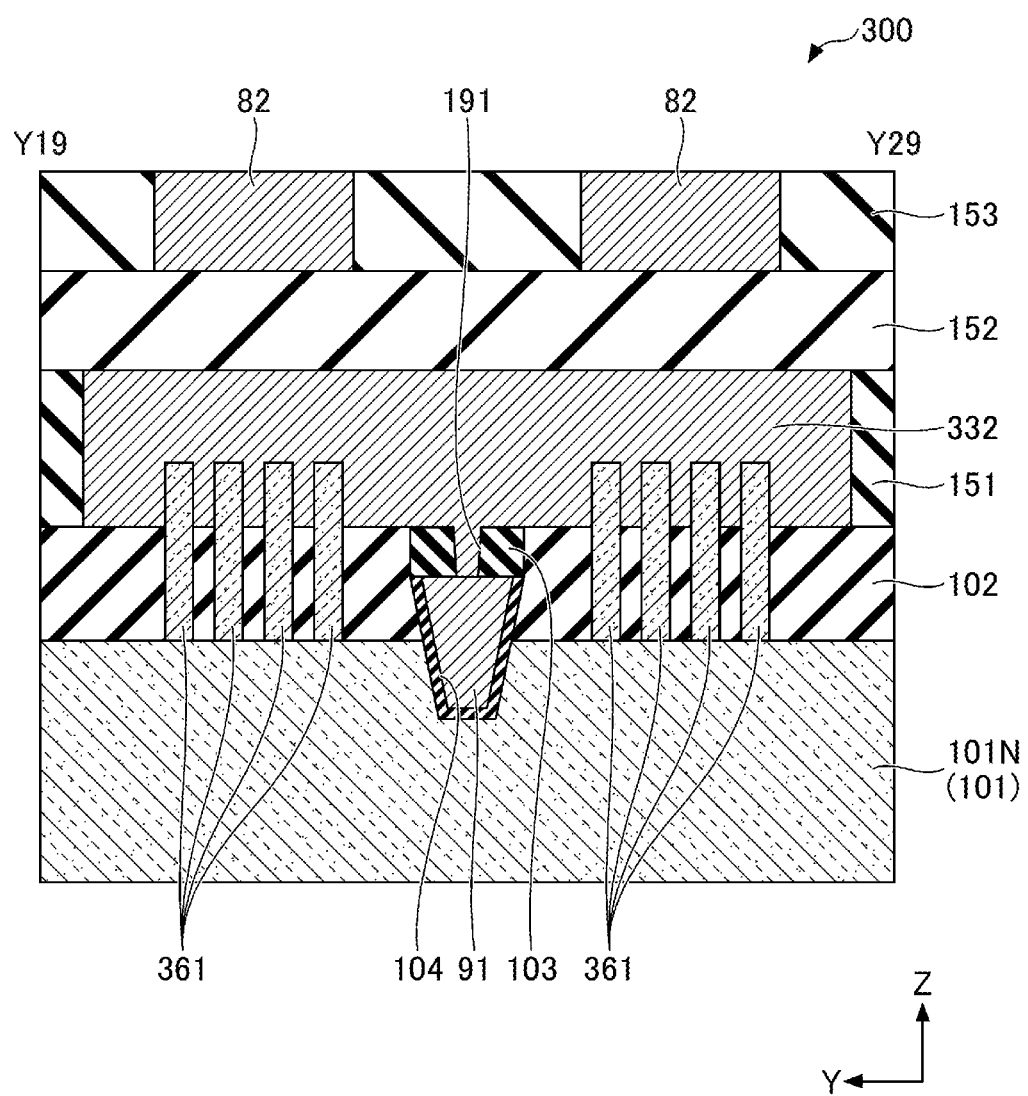
FIG. 24 is a first cross-sectional view illustrating the other diode according to the fourth embodiment.
Figure 25:
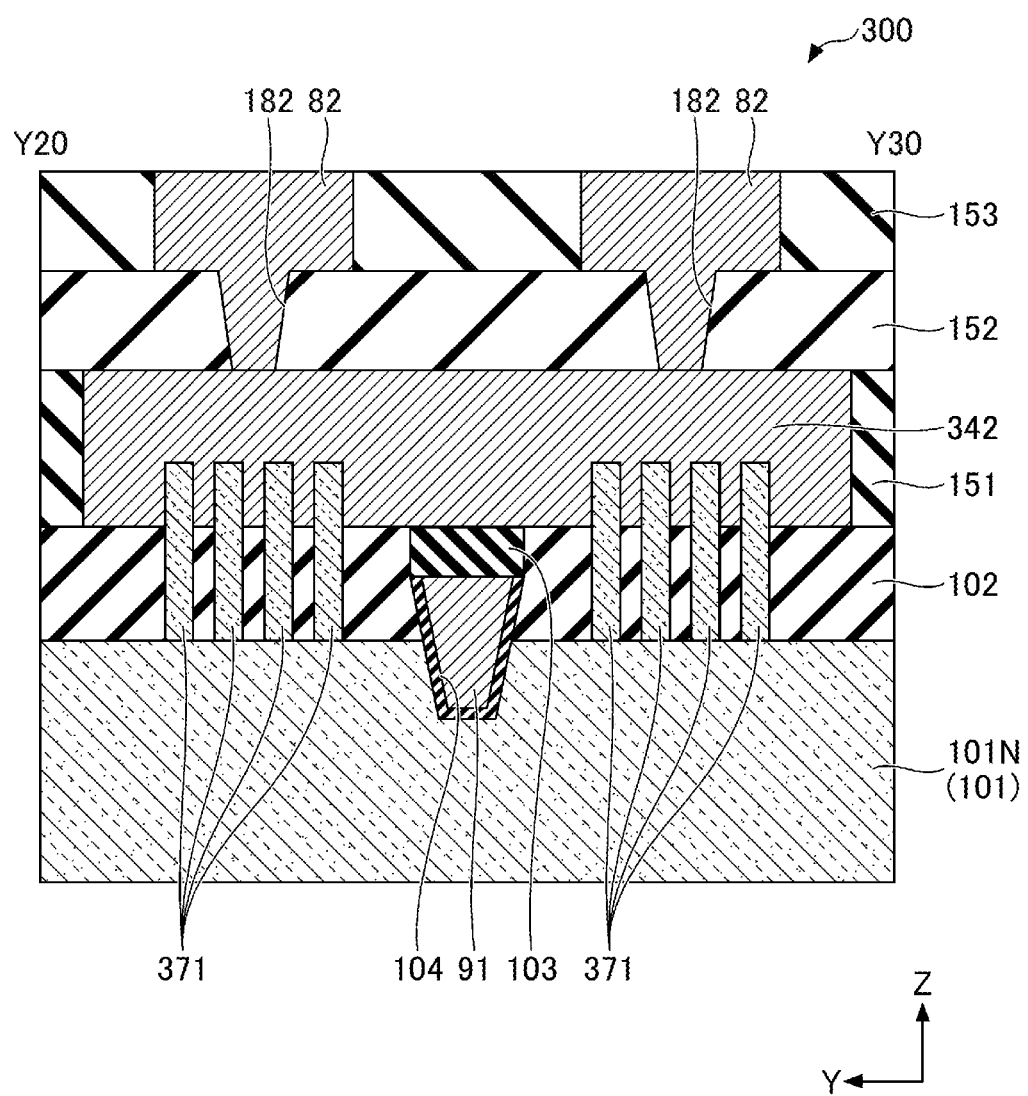
FIG. 25 is a second cross-sectional view illustrating the other diode according to the fourth embodiment.

Next, a configuration of the diode 300 according to the fourth embodiment will be described. FIG. 23 is a schematic diagram showing the planar configuration of the diode 300 according to the fourth embodiment. FIGS. 24 and 25 are cross-sectional views showing the diode 300 according to the fourth embodiment. FIG. 24 corresponds to a cross section cut along a line Y19-Y29 in FIG. 23. FIG. 25 corresponds to a cross section cut along a line Y20-Y30 in FIG. 23.

As shown in FIGS. 23 to 25, in the same manner as in the first embodiment, the power supply wiring 91 extending in the X-direction is formed. A plurality of fins 380, extending in the X-direction and standing in the Z-direction are formed on the exposed N-well 101N from the element separation film 102 on both sides of the power supply wiring 91 in the Y-direction. In the embodiment, four fins 380 are formed on both sides of the power supply wiring 91, respectively. Each fin 380 includes a plurality of (in the embodiment, two) P-type regions 361 and a plurality of (in the embodiment, two) N-type regions 371, which are alternatingly arranged. The P-type regions 361 of each fin 380 are aligned in the Y-direction, and the N-type regions 371 of each fin 380 are aligned in the Y-direction.

A plurality of local wirings 332 extending in the Y-direction and connected to each P-type region 361 are formed on the element separation film 102. In the embodiment, two local wirings 332 are formed. A plurality of local wirings 342 extending in the Y-direction and connected to each N-type region 371 are formed on element separation film 102. In the embodiment, two local wirings 342 are formed. A plurality of dummy-gate electrodes 330, such as so-called fin transistor gate electrodes, are formed so as to be arranged in the X-direction with the local wiring 332 or 342 interposed therebetween. Each of the dummy-gate electrodes 330 extends in the Y-direction. A dummy-gate insulation film (not shown) is formed between the dummy-gate electrode 330 and the fin 380.

As shown in FIGS. 23 and 24, a contact hole 191 is formed in the insulation film 103 between the local wiring 332 and the power supply wiring 91, and the local wiring 332 is connected to the power supply wiring 91 through a conductor in the contact hole 191.

As shown in FIGS. 23 and 25, a contact hole 182 reaching the local wiring 342 is formed in the insulation film 152. In the insulation film 153, a power supply wiring 82 which extends in the X-direction and is connected to the local wiring 342 through a conductor in the contact hole 182 is formed.

In the fourth embodiment, the diode 200 includes the power supply wiring 91 as a buried wiring and the diode 300 includes the power supply wiring 91 as a buried wiring. Thus, according to the fourth embodiment, a bidirectional diode including buried wirings can be implemented. Therefore, the configuration of the wirings according to the fourth embodiment is suitable for further miniaturization of semiconductor devices.

In addition, in the diode 200, instead of the power supply wiring 82, a power supply wiring connected to the local wiring 242 may be formed in the P-well 101P as a buried wiring. Similarly, in the diode 300, instead of the power supply wiring 82, a power supply wiring connected to local wiring 342 may be formed in the N-well 101N as a buried wiring. In these cases, in the diodes 200 and 300, instead of the power supply wiring 91, a power supply wiring connected to the local wiring 232 and a power supply wiring connected to the local wiring 332 may be formed in the insulation film 153.

Fifth Embodiment

Figure 26:
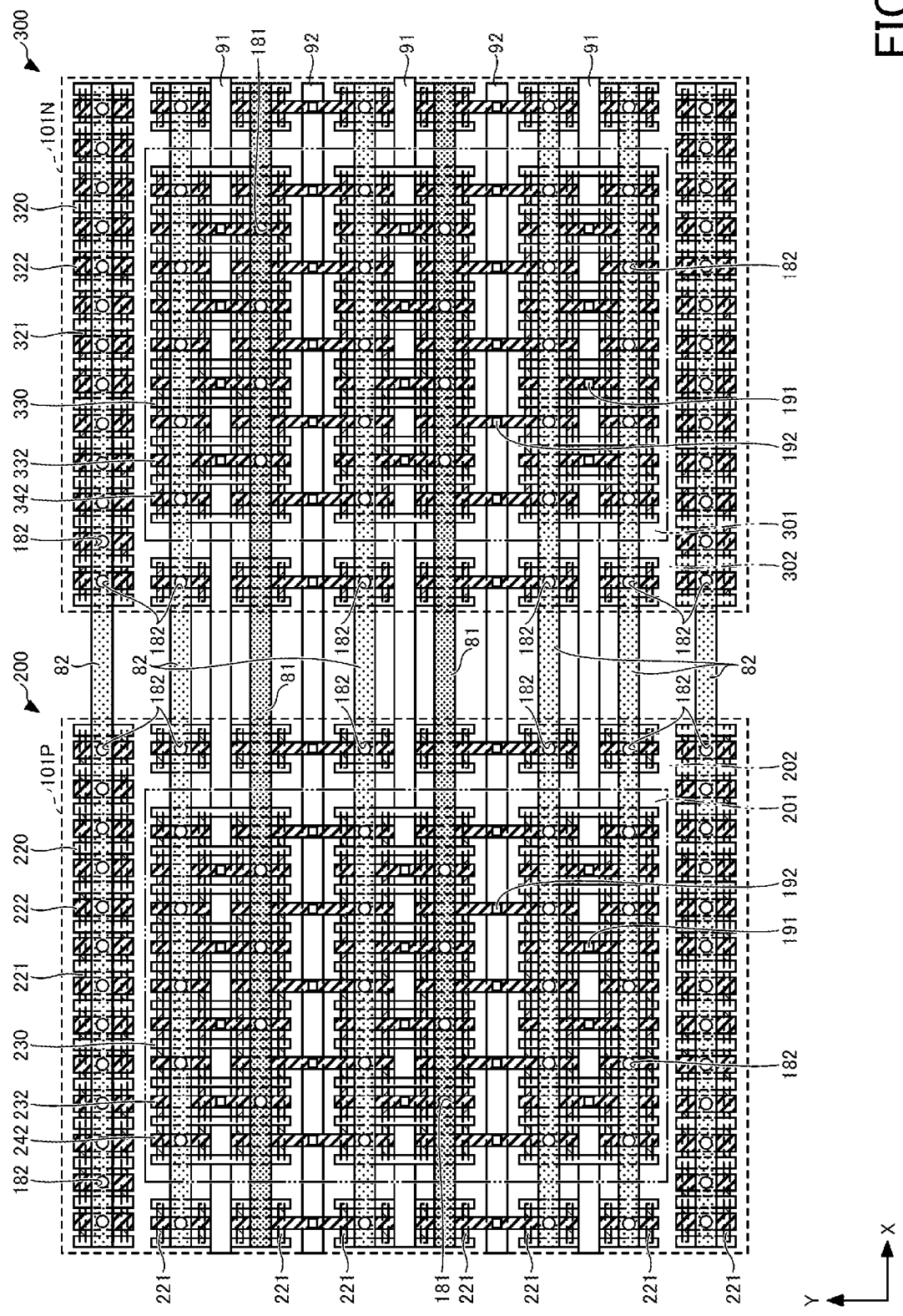
FIG. 26 is a diagram schematically depicting a planar configuration of two diodes according to a fifth embodiment.

Next, a fifth embodiment will be described. The fifth embodiment differs from the fourth embodiment mainly in a size of the diode. FIG. 26 is a schematic diagram showing a planar configuration of the diodes 200 and 300 according to the fifth embodiment.

As shown in FIG. 26, in the fifth embodiment, the diode 200 and the diode 300 are arranged in the X-direction side by side. Three power supply wirings 91 are provided in common for the diode 200 and the diode 300. Moreover, between the adjacent power supply wirings 91, one power supply wiring 92 is provided in common for the diode 200 and the diode 300.

In the main portion 201 of the diode 200, a plurality of fins 280 are provided so as to interpose the power supply wiring 91 or the power supply wiring 92 therebetween in the Y-direction. As in the fourth embodiment, each fin 280 includes a plurality of N-type regions 261 and a plurality of P-type regions 271, which are alternatingly arranged. As in the fourth embodiment, a local wiring 232 connected to the N-type region 261 and a plurality of local wirings 242 connected to the P-type region 271 are formed on the element separation film 102. The local wiring 232 is connected to the power supply wiring 91 through a conductor in the contact hole 191. That is, the power supply wiring 91 is connected to the N-type region 261 via the local wiring 232. The local wiring 242 is connected to the power supply wiring 92 through a conductor in the contact hole 192. That is, the power supply wiring 92 is connected to the P-type region 271 through the local wiring 242.

Additionally, the power supply wiring 82 connected to the local wiring 242 through the conductor in the contact hole 182 and the power supply wiring 81 connected to the local wiring 232 through the conductor in the contact hole 181 are formed in the insulation film 153 (see FIGS. 21 and 22).

In the main portion 301 of the diode 300, a plurality of fins 380 are provided so as to interpose the power supply wiring 91 or the power supply wiring 92 therebetween in the Y-direction. As in the fourth embodiment, each fin 380 includes a plurality of P-type regions 361 and a plurality of N-type regions 371, which are alternatingly arranged. As in the fourth embodiment, a local wiring 332 connected to the P-type region 361 and a plurality of local wirings 342 connected to the N-type region 371 are formed on the element separation film 102. The local wiring 332 is connected to the power supply wiring 91 through a conductor in the contact hole 191. That is, the power supply wiring 91 is connected to the P-type region 361 via the local wiring 332. The local wiring 342 is connected to the power supply wiring 92 through a conductor in the contact hole 192. That is, the power supply wiring 92 is connected to the N-type region 371 through the local wiring 342.

Additionally, the power supply wiring 82 connected to the local wiring 342 through the conductor in the contact hole 182 and the power supply wiring 81 connected to the local wiring 332 through the conductor in the contact hole 181 are formed in the insulation film 153 (see FIGS. 21 and 22).

In the fifth embodiment, the diode 200 includes the power supply wirings 91 and 92 as buried wirings, and the diode 300 includes the power supply wirings 91 and 92 as buried wirings. Thus, according to the fifth embodiment, a bidirectional diode including buried wirings can be implemented. Therefore, the configuration of the wirings according to the fifth embodiment is suitable for further miniaturization of semiconductor devices. In addition, according to the fifth embodiment, because buried wirings are provided, flow of electric current through the diodes 200 and 300 can be facilitated.

Furthermore, as in the third embodiment, the parasitic capacitance between a part of the power supply wiring 92 and the P-well 101P can be reduced and the parasitic capacitance between a part of the power supply wiring 91 and the N-well 101N can be reduced.

Buried wirings are not necessary to be provided at all sites between the groups each including four fins adjacent in the Y-direction. Buried wirings may be provided at a part of the sites. In the diode 200, either one of the power supply wirings 91 and 92 may be provided as a buried wiring. In the diode 300, either one of the power supply wiring 91 and 92 may be provided as a buried wiring.

Suitable materials used for the buried wiring (the power supply wiring 91, the power supply wiring 92, and the dummy-wiring 94) include, for example, ruthenium (Ru), cobalt (Co) and tungsten (W). Suitable materials used for the wiring provided above the fin (the power supply wiring 81, the power supply wiring 82, the power supply wiring 84, and the power supply wiring 85) include, for example, copper (Cu), ruthenium (Ru), and cobalt (Co). When copper or cobalt is used, a conductive base film (barrier metal film), such as a tantalum (Ta) film or a tantalum nitride (TaN) film, is preferably formed. When ruthenium is used, the base film may not be formed.

Suitable materials used for the local wiring include, for example, copper (Cu), ruthenium (Ru), cobalt (Co) and tungsten (W). When copper, cobalt, or tungsten is used, a conductive base film (barrier metal film), such as a titanium (Ti) film or a titanium nitride (TiN) film, is preferably formed. However, when ruthenium is used, the base film may not be formed. For the material for the conductor (via) in the contact hole, for example, the same material as that for the local wiring, or the same material as that for the wiring provided above the fin can be used.

Suitable material used for the substrate includes, for example, silicon (Si). For example, the fins can be formed by patterning the substrate. Furthermore, a silicide of a high melting point metal, such as nickel (Ni) or cobalt (Co), may be used for a part contacting with the local wiring of the fin.

Suitable materials used for the dummy-gate electrode include, for example, titanium (Ti), titanium nitride (TiN), or polycrystalline silicon (polysilicon). Suitable material used for the dummy-gate insulation film includes, for example, a high dielectric material such as a hafnium oxide, an aluminum oxide, or an oxide of hafnium and aluminum.

For example, the wirings provided above the fins (the power supply wiring 81, the power supply wiring 82, the power supply wiring 84, and the power supply wiring 85) are formed by a dual damascene process with contact holes provided below the fins. The wirings provided above the fins may be formed by a single damascene process, separate from the contact holes provided below them.

As described above, preferred embodiments of the present invention have been described in detail. However, it should be noted that the present invention is not limited to the confiscations or the like described above. In other words, embodiments can be modified and added without departing from the spirit of the present invention, and can be appropriately defined depending on its application.

What is claimed is:

1. A semiconductor device comprising:
    a substrate;
    a first groove formed in the substrate;
    a second groove formed in the substrate;
    a first wiring formed in the first groove;
    a second wiring formed in the second groove;
    a dummy-wiring formed in the substrate, and insulated from the first wiring and from the second wiring;
    a first circuit region provided with a first power supply wiring, and a first ground wiring;
    a second circuit region provided with a second power supply wiring, and a second ground wiring; and
    a bidirectional diode connected between the first ground wiring and the second ground wiring, and provided with a first diode and a second diode, wherein:
    the first diode includes
        a first impurity region of a first conductive type, electrically connected to the second ground wiring, and
        a second impurity region of a second conductive type, different from the first conductive type, electrically connected to the first ground wiring,
    the second diode includes
        a third impurity region of the second conductive type, electrically connected to the second ground wiring, and
        a fourth impurity region of the first conductive type, electrically connected to the first ground wiring,
    the first impurity region, the second impurity region, the third impurity region, or the fourth impurity region, or any combination of the impurity regions is connected to the first wiring,
    one of the first impurity region and the second impurity region is connected to the first wiring,
    one of the third impurity region and the fourth impurity region is connected to the second wiring,
    the first impurity region, the second impurity region, the third impurity region, and the fourth impurity region are formed in any of a plurality of fins formed on the substrate, and
    a number of first fins, of the plurality of fins, connected to the first wiring is less than a number of second fins adjacent to the first fins.

2. The semiconductor device according to claim 1, further comprising:
    a first guard ring portion surrounding the first diode in a plan view; and
    a second guard ring portion surrounding the second diode in a plan view.

3. The semiconductor device according to claim 1,
    wherein the first wiring and the second wiring are connected to each other.

4. The semiconductor device according to claim 1, further comprising:
    a third wiring formed in the substrate, the other of the first impurity region and the second impurity region being connected to the third wiring; and
    a fourth wiring formed in the substrate, the other of the third impurity region and the fourth impurity region being connected to the fourth wiring.

5. The semiconductor device according to claim 4, wherein the third wiring and the fourth wiring are connected to each other.

6. The semiconductor device according to claim 1,
    wherein the first diode includes a fifth impurity region of the first conductive type, formed in the substrate,
    wherein the second diode includes a sixth impurity region of the second conductive type, formed in the substrate,
    wherein the first impurity region and the second impurity region are arranged separated from each other on the fifth impurity region, and
    wherein the third impurity region and the fourth impurity region are arranged separated from each other on the sixth impurity region.

7. The semiconductor device according to claim 6,
    wherein in a plan view, the first wiring extends in a direction different from a direction in which the first impurity region and the second impurity region are aligned, and
    wherein in a plan view, the first wiring extends in a direction different from a direction in which the third impurity region and the fourth impurity region are aligned.

8. The semiconductor device according to claim 6,
    wherein in a plan view, the first wiring extends in a direction parallel to a direction in which the first impurity region and the second impurity region are aligned, and
    wherein in a plan view, the first wiring extends in a direction parallel to a direction in which the third impurity region and the fourth impurity region are aligned.

9. The semiconductor device according to claim 1,
    wherein the first impurity region and the second impurity region are arranged adjacent to each other on the substrate, and
    wherein the third impurity region and the fourth impurity region are arranged adjacent to each other on the substrate.

10. The semiconductor device according to claim 9,
    wherein in a plan view, the first wiring extends in a direction different from a direction in which the first impurity region and the second impurity region are aligned, and
    wherein in a plan view, the first wiring extends in a direction different from a direction in which the third impurity region and the fourth impurity region are aligned.

11. The semiconductor device according to claim 9,
wherein in a plan view, the first wiring extends in a direction parallel to a direction in which the first impurity region and the second impurity region are aligned, and
wherein in a plan view, the first wiring extends in a direction parallel to a direction in which the third impurity region and the fourth impurity region are aligned.

12. A semiconductor device comprising:
a substrate;
a first wiring formed in the substrate;
a second wiring formed in the substrate;
a first circuit region provided with a first power supply wiring, and a first ground wiring;
a second circuit region provided with a second power supply wiring, and a second ground wiring; and
a bidirectional diode connected between the first ground wiring and the second ground wiring, and provided with a first diode and a second diode, wherein:
the first diode includes
  a first impurity region of a first conductive type, electrically connected to the second ground wiring, and
  a second impurity region of a second conductive type, different from the first conductive type, electrically connected to the first ground wiring,
the second diode includes
  a third impurity region of the second conductive type, electrically connected to the second ground wiring, and
  a fourth impurity region of the first conductive type, electrically connected to the first ground wiring,
the first impurity region, the second impurity region, the third impurity region, or the fourth impurity region, or any combination of the impurity regions is connected to the first wiring,
one of the first impurity region and the second impurity region is connected to the first wiring,
one of the third impurity region and the fourth impurity region is connected to the second wiring,
the first impurity region, the second impurity region, the third impurity region, and the fourth impurity region are formed in any of a plurality of fins formed on the substrate, and
a number of first fins, of the plurality of fins, connected to the first wiring is less than a number of second fins adjacent to the first fins.

13. The semiconductor device according to claim 12,
wherein a power supply potential is supplied to the first wiring from a rear surface of the substrate, and
wherein the power supply potential is supplied to the second wiring from the rear surface of the substrate.

14. The semiconductor device according to claim 12, wherein the first wiring and the second wiring are connected to each other.

15. The semiconductor device according to claim 12, further comprising:
a third wiring formed in the substrate, the other of the first impurity region and the second impurity region being connected to the third wiring; and
a fourth wiring formed in the substrate, the other of the third impurity region and the fourth impurity region being connected to the fourth wiring.

16. The semiconductor device according to claim 15, wherein the third wiring and the fourth wiring are connected to each other.

17. The semiconductor device according to claim 12,
wherein the first diode includes a fifth impurity region of the first conductive type, formed in the substrate,
wherein the second diode includes a sixth impurity region of the second conductive type, formed in the substrate,
wherein the first impurity region and the second impurity region are arranged separated from each other on the fifth impurity region, and
wherein the third impurity region and the fourth impurity region are arranged separated from each other on the sixth impurity region.

18. The semiconductor device according to claim 17,
wherein in a plan view, the first wiring extends in a direction different from a direction in which the first impurity region and the second impurity region are aligned, and
wherein in a plan view, the first wiring extends in a direction different from a direction in which the third impurity region and the fourth impurity region are aligned.

19. The semiconductor device according to claim 17,
wherein in a plan view, the first wiring extends in a direction parallel to a direction in which the first impurity region and the second impurity region are aligned, and
wherein in a plan view, the first wiring extends in a direction parallel to a direction in which the third impurity region and the fourth impurity region are aligned.

20. The semiconductor device according to claim 12,
wherein the first impurity region and the second impurity region are arranged adjacent to each other on the substrate, and
wherein the third impurity region and the fourth impurity region are arranged adjacent to each other on the substrate.

21. The semiconductor device according to claim 20,
wherein in a plan view, the first wiring extends in a direction different from a direction in which the first impurity region and the second impurity region are aligned, and
wherein in a plan view, the first wiring extends in a direction different from a direction in which the third impurity region and the fourth impurity region are aligned.

22. The semiconductor device according to claim 20,
wherein in a plan view, the first wiring extends in a direction parallel to a direction in which the first impurity region and the second impurity region are aligned, and
wherein in a plan view, the first wiring extends in a direction parallel to a direction in which the third impurity region and the fourth impurity region are aligned.

23. The semiconductor device according to claim 12, further comprising:
a first guard ring portion surrounding the first diode in a plan view; and
a second guard ring portion surrounding the second diode in a plan view.

24. The semiconductor device according to claim 23,
wherein a power supply potential is supplied to the first wiring from above the first guard ring portion, and
wherein a power supply potential is supplied to the second wiring from above the second guard ring portion.

25. The semiconductor device according to claim 23,
wherein a power supply potential is supplied to the first wiring from outside the first guard ring portion in a plan view, and
wherein a power supply potential is supplied to the second wiring from outside the second guard ring portion in a plan view.

* * * * *